(12) United States Patent
Chang

(10) Patent No.: US 8,288,192 B2
(45) Date of Patent: Oct. 16, 2012

(54) METHOD OF MANUFACTURING A CAPACITIVE ELECTROMECHANICAL TRANSDUCER

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 12/918,660

(22) PCT Filed: Apr. 28, 2009

(86) PCT No.: PCT/JP2009/058720
§ 371 (c)(1),
(2), (4) Date: Aug. 20, 2010

(87) PCT Pub. No.: WO2009/133961
PCT Pub. Date: Nov. 5, 2009

(65) Prior Publication Data
US 2010/0327380 A1 Dec. 30, 2010

(30) Foreign Application Priority Data

May 2, 2008 (JP) ................. 2008-120391
Mar. 11, 2009 (JP) ................. 2009-057263

(51) Int. Cl.
*H01L 21/00* (2006.01)
(52) U.S. Cl. ............... 438/54; 438/64; 257/419
(58) Field of Classification Search .......... 438/53, 438/64; 257/419, E21.211, E29.324
See application file for complete search history.

(56) References Cited

U.S. PATENT DOCUMENTS

| 2010/0107758 A1 | 5/2010 | Kandori et al. | 73/504.08 |
| 2010/0164023 A1* | 7/2010 | Knese et al. | 257/415 |
| 2010/0207484 A1 | 8/2010 | Chang | 310/300 |
| 2011/0024799 A1* | 2/2011 | Minoura et al. | 257/201 |

FOREIGN PATENT DOCUMENTS

| EP | 1 382 565 A1 | 1/2004 |
| EP | 1 098 719 B1 | 4/2007 |
| GB | 849447 | 9/1960 |
| JP | 6-216111 A | 8/1994 |

(Continued)

OTHER PUBLICATIONS

A.S. Ergun et al., "Capacitive Micromachined Ultrasonic Transducers: Fabrication Technology," IEEE Transactions on Ultrasonics, Ferroelectrics, and Frequency Control, vol. 52, No. 12, pp. 2242-2258 (Dec. 2005).
P.-C. Eccardt et al., "Micromachined Transducers for Ultrasound Applications," IEEE Ultrasonics Symposium, pp. 1609-1618 (1997).
Office Action issued Jul. 17, 2012, in counterpart P.R.C. (China) patent application 200980115089.3, with translation.

*Primary Examiner* — Phuc Dang
(74) *Attorney, Agent, or Firm* — Fitzpatrick, Cella, Harper & Scinto

(57) ABSTRACT

In a method of manufacturing a capacitive electromechanical transducer, a first electrode (8) is formed on a substrate (4), an insulating layer (9) which has an opening (6) leading to the first electrode is formed on the first electrode (8), and a sacrificial layer is formed on the insulating layer. A membrane (3) having a second electrode (1) is formed on the sacrificial layer, and an aperture is provided as an etchant inlet in the membrane. The sacrificial layer is etched to form a cavity (10), and then the aperture serving as an etchant inlet is sealed. The etching is executed by electrolytic etching in which a current is caused to flow between the first electrode (8) and an externally placed counter electrode through the opening (6) and the aperture of the membrane.

12 Claims, 17 Drawing Sheets

FOREIGN PATENT DOCUMENTS

| | | |
|---|---|---|
| JP | 7-115209 A | 5/1995 |
| JP | 2005-027186 A | 1/2005 |
| JP | 2006-319712 A | 11/2006 |
| WO | WO 2006/092820 A2 | 9/2006 |

* cited by examiner

METHOD OF MANUFACTURING A CAPACITIVE ELECTROMECHANICAL TRANSDUCER

TECHNICAL FIELD

The present invention relates to a method of manufacturing a capacitive electromechanical transducer that is used as an ultrasonic transducer or the like, and relates to a capacitive electromechanical transducer.

BACKGROUND ART

In recent years, capacitive electromechanical transducers manufactured through a micromachining process have been researched actively (see Japanese Patent Application Laid-Open No. 2006-319712). A normal capacitive electromechanical transducer has a lower electrode, a membrane (diaphragm), which is supported to keep a given distance from the lower electrode, and an upper electrode, which is disposed on a surface of the membrane. This is known as, for example, a capacitive micromachined ultrasonic transducer (CMUT).

The above-mentioned capacitive micromachined ultrasonic transducer uses a light-weight membrane to send and receive ultrasonic waves, and it is easy to obtain a capacitive micromachined ultrasonic transducer that has excellent broadband characteristics in liquids as well as in the air. The CMUT enables more accurate diagnosis than conventional medical diagnosis, and is therefore beginning to attract attention as a promising technology.

The operation principle of the capacitive micromachined ultrasonic transducer is described. To transmit ultrasonic waves, a DC voltage overlapped with a minute AC voltage is applied between the lower electrode and the upper electrode. This causes the membrane to vibrate, thereby generating ultrasonic waves. When ultrasonic waves are received, the membrane is deformed by the ultrasonic waves, and the deformation causes a capacity change between the lower electrode and the upper electrode, from which signals are detected.

The theoretical sensitivity of the capacitive electromechanical transducer is in inverse proportion to the square of the distance between its electrodes ("gap") (see IEEE Ultrasonic Symposium, 1997, p. 1609-1618). It is said that a gap of 100 nm or less is necessary to manufacture a highly sensitive transducer, and the "gap" in the CMUT has recently been made as narrow as 2 μm to 100 nm or less.

A commonly employed method of forming the "gap" in the capacitive electromechanical transducer includes providing a sacrificial layer that is as thick as a desired gap between the electrodes, forming the membrane on top of the sacrificial layer, and then removing the sacrificial layer. This and similar technologies are disclosed in U.S. Pat. No. 6,426,582, Japanese Patent Application Laid-Open No. 2005-027186, Japanese Patent Application Laid-Open No. H06-216111, IEEE Transactions on Ultrasonics, Ferroelectrics, and Frequency Control, Vol. 52, No. 12, December 2005, p. 2242-2258.

DISCLOSURE OF THE INVENTION

As described above, it is desired to set a narrow gap between the electrodes in order to raise the electromechanical transduction efficiency of the capacitive electromechanical transducer. The aforementioned U.S. Pat. No. 6,426,582 and Japanese Patent Application Laid-Open No. 2005-027186 also provide concrete suggestions about how to raise the electromechanical transduction efficiency.

However, setting a narrow gap between electrodes is not enough because the removal of the sacrificial layer (made of, for example, Si, $SiO_2$, or metal) becomes increasingly difficult as the "gap" becomes narrower. For instance, as described in the aforementioned IEEE Transactions on Ultrasonics, Ferroelectrics, and Frequency Control, Vol. 52, No. 12, December 2005, p. 2242-2258, it is said that the etching process takes several days to a week at low temperature. However, prolonged immersion in an etchant damages the membrane of the capacitive electromechanical transducer and lowers the yield rate.

There is a contrasting method in which the temperature is raised in order to set the etching rate higher. However, a soft (low in mechanical strength) membrane could be broken by bubbles that accompany a high-temperature etching reaction, and hence there is a possibility of a declined yield rate.

The etching of a large-area sacrificial layer when the gap between the electrodes is narrow is thus low in productivity because of the diffusion-limited control of an etchant. Accordingly, high-speed etching is wished to be realized. If the time it takes to etch away the sacrificial layer can be cut short, the throughput of transducer production is improved.

Etching the sacrificial layer requires providing an inlet that enables an etchant to reach the sacrificial layer from the outside. When the etchant inlet is larger in size and there are more etchant inlets, in other words, when the exposed surface of the sacrificial layer is larger, the etching rate is higher. However, providing a large hole or many holes as an etchant inlet in a micro electromechanical transducer adversely affects the performance of the original mechanical structure, and could impair the design performance, lifespan, stability, and reliability of the transducer. For instance, providing a large hole or many holes in the membrane of a capacitive electromechanical transducer greatly influences the seismic mass, the stress of a vibrating portion, the vibration frequency, the vibration node, the vibration displacement, and the like. It is therefore desirable to minimize the size and number of etchant inlets in capacitive electromechanical transducers.

Another method of etching the sacrificial layer is described in Japanese Patent Application Laid-Open No. H06-216111, in which the sacrificial layer between the upper and lower electrodes is etched by applying a vertical direction magnetic field to an electric current flowing in the etchant. However, this method requires the sacrificial layer to have a large exposed surface (etchant inlet) on its side face and to be exposed in many directions. Obtaining a significant effect with this method is difficult when there are few etchant inlets or when etchant inlets are small in size.

As has been described, in order to improve the performance of the transducer, a capacitive electromechanical transducer needs to form a sacrificial layer thin and relatively large in area. However the removal efficiency of such a sacrificial layer is poor and it is an important object to solve the trade-off relation between the removal efficiency and the transducer's performance, stability, throughput, and the like. The present invention proposes a method of manufacturing a capacitive electromechanical transducer, with which the sacrificial layer can be etched at relatively high speed when the "gap" is relatively narrow, and a capacitive electromechanical transducer structured to fulfill that purpose.

SUMMARY OF THE INVENTION

In view of the above-mentioned problems, according to the present invention, a first method of manufacturing a capacitive electromechanical transducer has the following features.

A first electrode is formed on a substrate, an insulating layer is formed on the first electrode, the insulating layer having an opening that leads to the first electrode, a sacrificial layer is formed on the insulating layer, a membrane which has a second electrode is formed on the sacrificial layer, and an aperture is provided as an etchant inlet in the membrane. Then, the sacrificial layer is etched to form a cavity. Then, the aperture that serves as the etchant inlet is sealed. Further, the etching is executed by electrolytic etching in which a current is caused to flow between the first electrode and an externally placed counter electrode through the opening, the sacrificial layer, and the aperture.

Further, in view of the above-mentioned problems, according to the present invention, a second method of manufacturing a capacitive electromechanical transducer has the following features. A first electrode is formed on a substrate, an insulating layer is formed on the first electrode, a sacrificial layer is formed on the insulating layer, a membrane is formed on the sacrificial layer, multiple apertures including an aperture that serves as an etchant inlet, are provided in the membrane, and a second electrode is provided on the membrane. Then, the sacrificial layer is etched to form a cavity, and the aperture that serves as the etchant inlet is sealed. Further, the etching is executed by electrolytic etching in which a current is caused to flow between the second electrode and an externally placed counter electrode through at least one of the multiple apertures of the membrane that leads to the second electrode, the sacrificial layer, and the aperture that serves as the etchant inlet.

Further, in view of the above-mentioned problems, according to the present invention, a first capacitive electromechanical transducer includes: a substrate; a first electrode formed on the substrate; a membrane supported by a supporter disposed on the substrate, at a distance from the first electrode, with a cavity formed between the membrane and the first electrode; and a second electrode disposed on the membrane. Further, at least one of the first electrode and the second electrode is covered with an insulating layer, a sealed portion is provided as an aperture leading to the cavity in the membrane and then sealed, and an aperture leading to one of the first electrode and the second electrode formed is formed in the insulating layer.

Further, in view of the above-mentioned problems, according to the present invention, a second capacitive electromechanical transducer includes multiple transducer portions each including: a substrate; a first electrode formed on the substrate; a membrane supported by a supporter disposed on the substrate, at a distance from the first electrode, with a cavity formed between the membrane and the first electrode; and a second electrode disposed on the membrane. Then, at least one of the first electrode and the second electrode is covered with an insulating layer, and a sealed portion is provided as an aperture leading to the cavity in the membrane of a first transducer portion among the multiple transducer portions, and then sealed. Further, an aperture leading to one of the first electrode and the second electrode is formed in the insulating layer of a second transducer portion different from the first transducer portion, and a cavity of the first transducer portion and a cavity of the second transducer portion are connected to each other through a connection port provided between the first transducer portion and the second transducer portion.

According to a manufacturing method of the present invention, in which openings or apertures as those described above are formed, the sacrificial layer can be etched at relatively high speed without depending on diffusion-limited control, and cavities are formed in a favorable manner. More specifically, the etching rate can be steadily kept constant, or constant at a high level, via the anode voltage of the first electrode or the second electrode without increasing the size or number of the openings or apertures considerably. Productivity (for example, shortened manufacturing time, yield rate) and performance (for example, uniformity of transducer performance, enhanced transducer sensitivity) are thus improved even in a large-area capacitive electromechanical transducer (CMUT, for example) and an array capacitive electromechanical transducer which has multiple transducer portions.

Further features of the present invention will become apparent from the following description of exemplary embodiments with reference to the attached drawings.

BEST MODE FOR CARRYING OUT THE INVENTION

Figure 1:
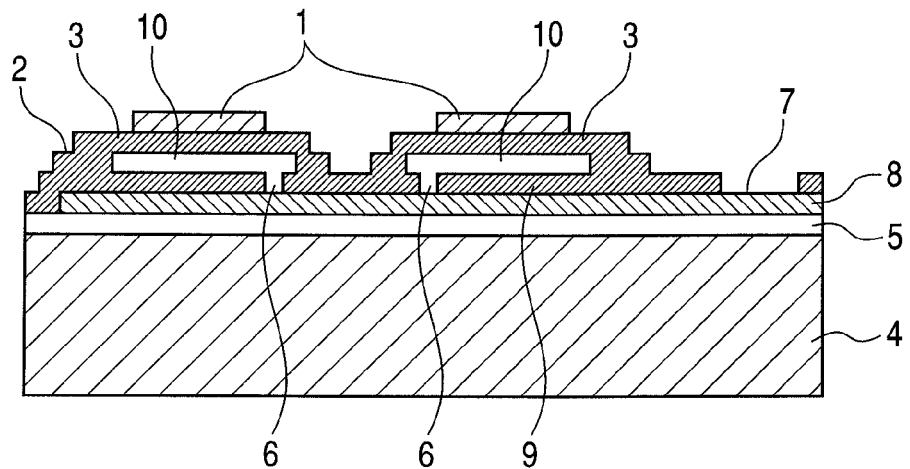
FIG. 1 is a sectional view illustrating a structural example of a capacitive electromechanical transducer according to an embodiment mode of the present invention.

An embodiment mode of the present invention is described below. FIG. 1 is a sectional view illustrating a basic structure of a capacitive electromechanical transducer according to the embodiment mode of the present invention.

On a substrate 4, a first insulating film 5 is provided and then a lower electrode 8 having a low resistance is placed. A membrane supporter 2 formed on the lower electrode 8 supports a membrane 3, and is fixed to the substrate 4 through a second insulating film 9 which contains an opening 6. A cavity (space) 10 surrounded by the substrate 4, the membrane 3, and the membrane supporter 2 is formed. The lower electrode 8 is exposed to the cavity 10 via the opening 6. An electrical connection to the lower electrode 8 is made through a pad 7.

An upper electrode 1 is placed on a top surface of or inside the membrane 3. The upper electrode 1 is formed to face the lower electrode 8 and forms the capacitive electromechanical transducer of this embodiment. A pad of the upper electrode 1 is not illustrated in FIG. 1.

Usually, in order to raise an electromechanical transduction coefficient of a capacitive electromechanical transducer, a DC bias voltage needs to be applied between the upper electrode 1 and the lower electrode 8 while the transducer is in operation. The action of the DC bias voltage causes electrostatic attraction to pull the upper electrode 1, resulting in a downward displacement at the center of the membrane 3. Once the DC bias voltage exceeds a given voltage, however, the membrane 3 could yield and come into contact with the second insulating film 9 (i.e. collapse), which lowers the electromechanical transduction coefficient against the original intention. This given voltage is called a collapse voltage. The bias voltage is adjusted so as to avoid the collapse.

As described above, the capacitive electromechanical transducer of this embodiment mode includes the substrate 4, the lower electrode 8 which is a first electrode formed on the substrate, the membrane 3 which is supported by the supporter 2 formed on the substrate at a distance from the first electrode and which contains the cavity 10 formed therein, and the upper electrode 1 which is a second electrode disposed on the membrane. At least one of the first electrode 8 and the second electrode 1 is covered with an insulating layer (denoted by reference numeral 3 or 9). The membrane 3 is provided with a sealing portion which is provided as an aperture that leads to the cavity 10 and then sealed. An aperture leading to the first electrode or the second electrode is formed in the insulating layer. In the mode of FIG. 1, the opening 6 leading to the first electrode 8 is formed in the insulating layer 9. In examples that are described later, which include one illustrated in FIGS. 5A and 5B, an aperture 24 leading to the second electrode 1 is formed in the membrane 3 which is an insulating layer.

The capacitive electromechanical transducer structured as above can be manufactured by the following manufacturing method. The first electrode 8 is formed on the substrate 4. The insulating layer 9 in which the opening 6 leading to the first electrode is opened is formed on the first electrode. A sacrificial layer is formed on the insulating layer. The membrane 3 having the second electrode 1 is formed on the sacrificial layer. An aperture is provided as etchant inlets in the membrane. The sacrificial layer is etched to form the cavity 10, and the aperture as the etchant inlet is sealed. The above-mentioned etching is executed by electrolytic etching in which a current is caused to flow between the first electrode 8 and an externally placed counter electrode through the opening 6, the sacrificial layer, and the aperture. The opening 6 and the aperture are desirably as far apart from each other as possible.

Figure 5A:
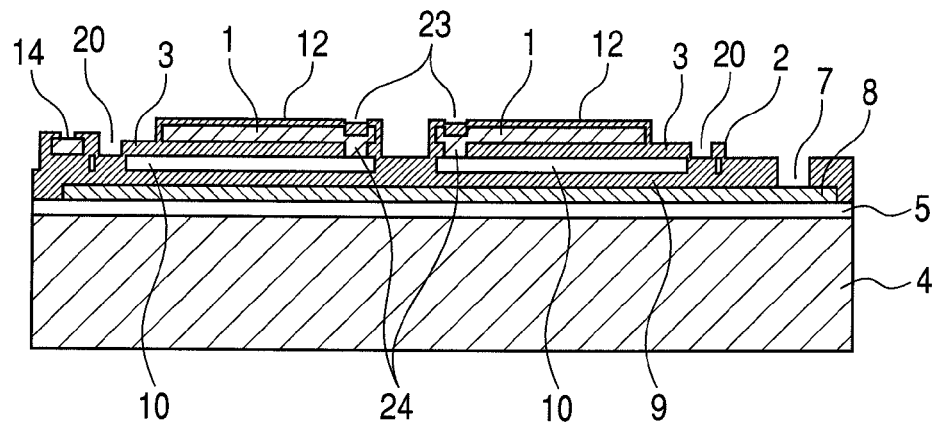
FIG. 5A is a sectional view illustrating a structure of a capacitive electromechanical transducer according to a sixth embodiment of the present invention.
Figure 5B:
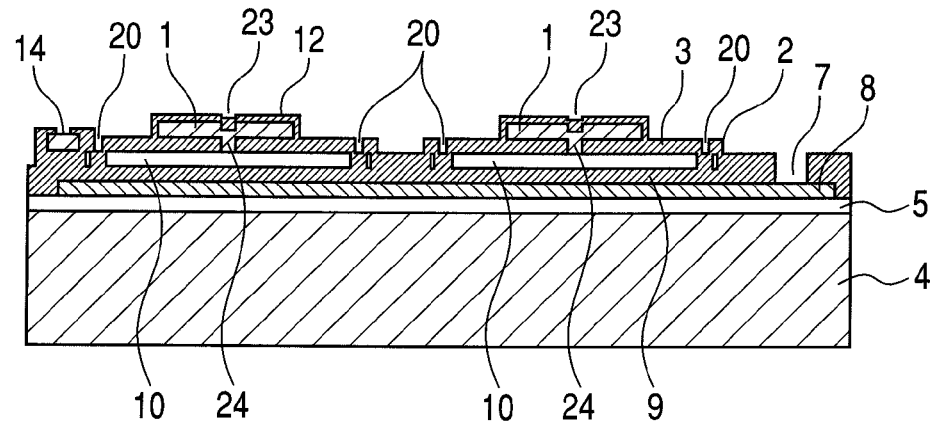
FIG. 5B is a sectional view illustrating a structure of a capacitive electromechanical transducer according to a seventh embodiment of the present invention.

The following manufacturing method may also be employed (see FIGS. 5A and 5B). The first electrode 8 is formed on the substrate 4. The insulating layer 9 is formed on the first electrode. A sacrificial layer is formed on the insulating layer. The membrane 3 is formed on the sacrificial layer. Multiple apertures 24 including an aperture as an etchant inlet are opened in the membrane. The second electrode 1 is provided on the membrane. The sacrificial layer is etched to form the cavity 10, and the aperture as the etchant inlet is sealed to form a sealing portion 20. The above-mentioned etching is executed by electrolytic etching in which a current is caused to flow between the second electrode 1 and an externally placed counter electrode through the apertures 24 that are opened in the membrane and lead to the second electrode, the sacrificial layer, and the aperture that serves as the etchant inlet. Also in this method, the apertures that lead to the second electrode 1 and the aperture that serves as the etchant inlet are desirably as far apart from each other as possible.

Figure 10A:
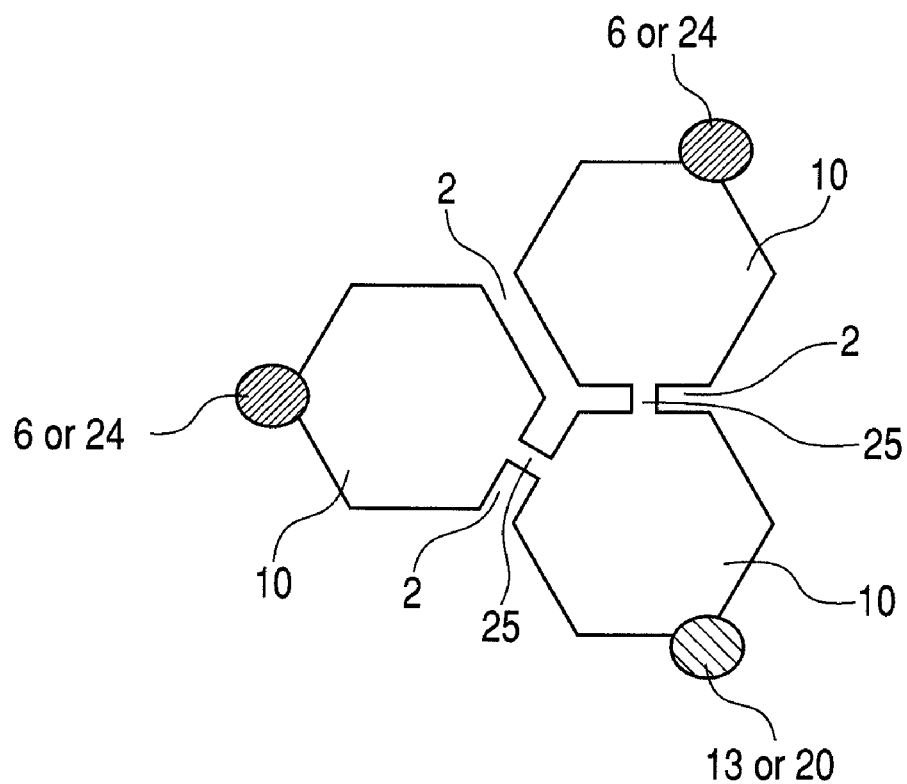
FIGS. 10A and 10B are perspective plan views illustrating structural examples of a capacitive electromechanical transducer with multiple transducer portions according to a ninth embodiment of the present invention, in which cavities are arranged in an array and a connection port is provided between adjacent cavities.
Figure 10B:
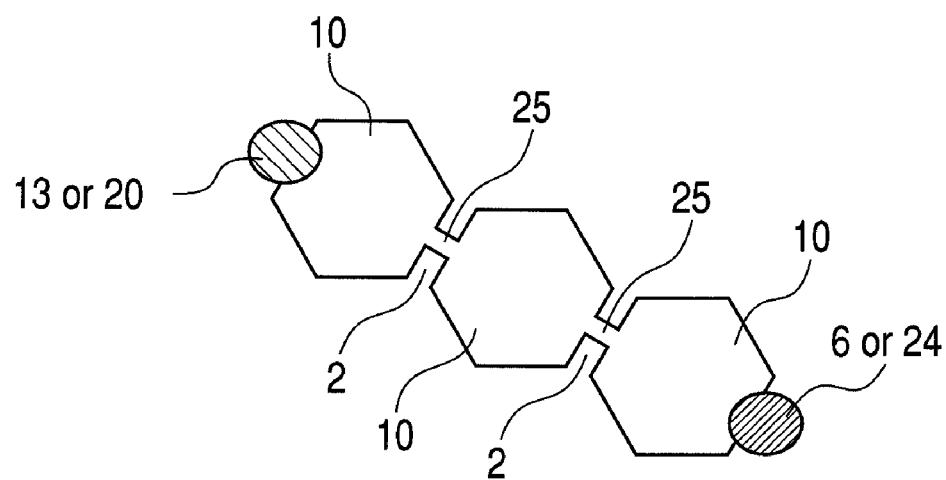

The capacitive electromechanical transducer can be structured to include multiple transducer portions as illustrated in FIG. 1. Each transducer portion has the substrate 4, the first electrode 8 which is formed on the substrate, the membrane 3 which is supported by the supporter 2 formed on the substrate at a distance from the first electrode and which contains the cavity 10, and the second electrode 1 which is disposed on the membrane. At least one of the first electrode 8 and the second electrode 1 is covered with an insulating layer (denoted by reference numeral 3 or 9). As illustrated in FIGS. 10A and 10B, the membrane of a first transducer portion is provided with the sealing portion 20 which is provided as an aperture that leads to the cavity 10 and then sealed. An aperture (denoted by reference numeral 6 or 24) leading to the first electrode or the second electrode is formed in the insulating layer of a second transducer portion, which is separate from the first transducer portion. The cavity of the first transducer portion and the cavity of the second transducer portion are connected to each other through a connection port 25 provided between the transducer portions.

The capacitive electromechanical transducer structured to include multiple device portions can be manufactured by the following manufacturing method. Electrolytic etching is performed through an aperture that leads to the first electrode or the second electrode, through the sacrificial layer that is formed around the cavities in the first and second transducer portions and around the connection port 25, and through the aperture that serves as an etchant inlet. In this electrolytic etching, a current is caused to flow between the first electrode or the second electrode and an externally placed counter electrode, and the sacrificial layer is etched to collectively form the cavity of the first transducer portion and the cavity of the second transducer portion. Also in this method, the aperture that leads to the first electrode or the second electrode and the aperture that serves as the etchant inlet are desirably as far apart from each other as possible.

According to a manufacturing method of this embodiment mode, the sacrificial layer can be etched at relatively high speed by electrolytic etching without depending on diffusion-limited control, and a cavity can be formed to be sufficiently thin in a favorable manner. More specifically, the etching rate can steadily be kept constant, or constant at a high level, via the anode voltage of the first electrode or the second electrode without increasing the size or the number of the openings or apertures so much. Shortened manufacturing time, uniformized transducer performance, enhanced transducer sensitivity, and improved yield rate are thus accomplished even in a large-area capacitive electromechanical transducer and an array capacitive electromechanical transducer.

EMBODIMENTS

Embodiments of the present invention are described below with reference to the drawings.

First Embodiment

Figure 2A:
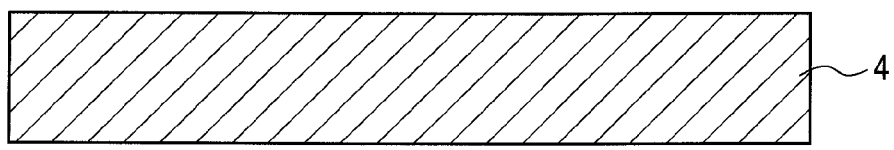
FIGS. 2A, 2B, 2C, 2D, 2E, 2F, 2G, 2H, 2I, 2J, 2K, 2L, 2M and 2N are manufacture process step diagrams of a capacitive electromechanical transducer manufacturing method according to the embodiment mode and an embodiment of the present invention.
Figure 2B:
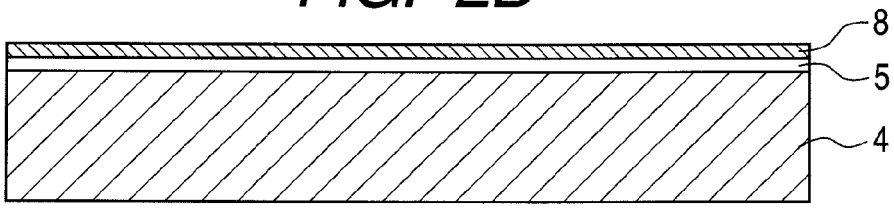
Figure 2C:
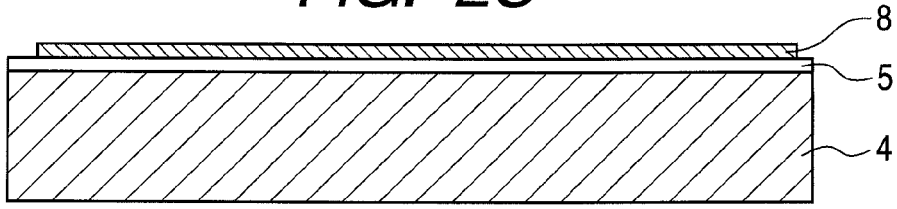
Figure 2D:
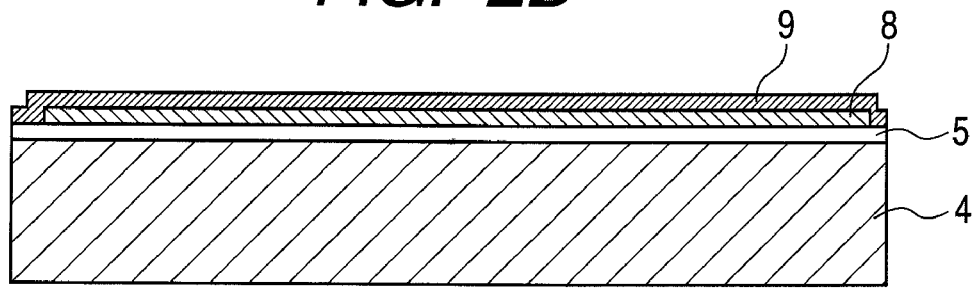
Figure 2E:
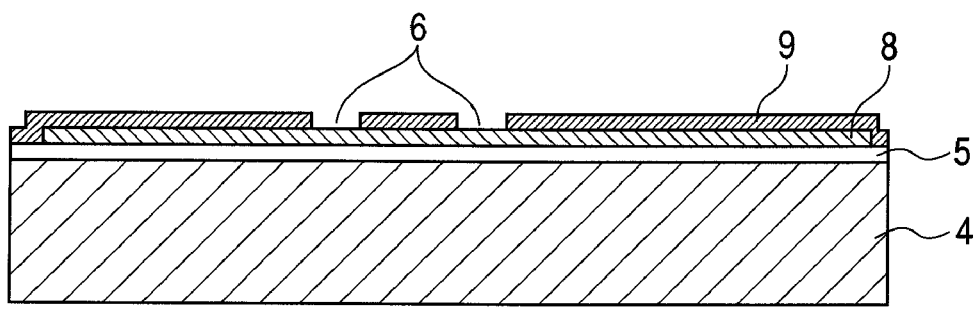
Figure 2F:
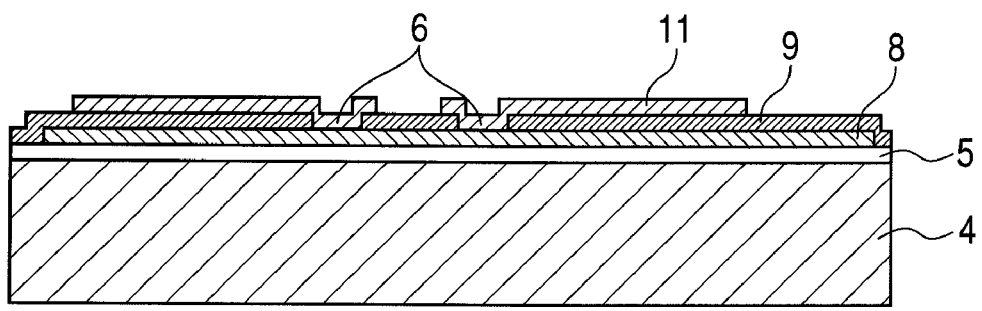
Figure 2G:
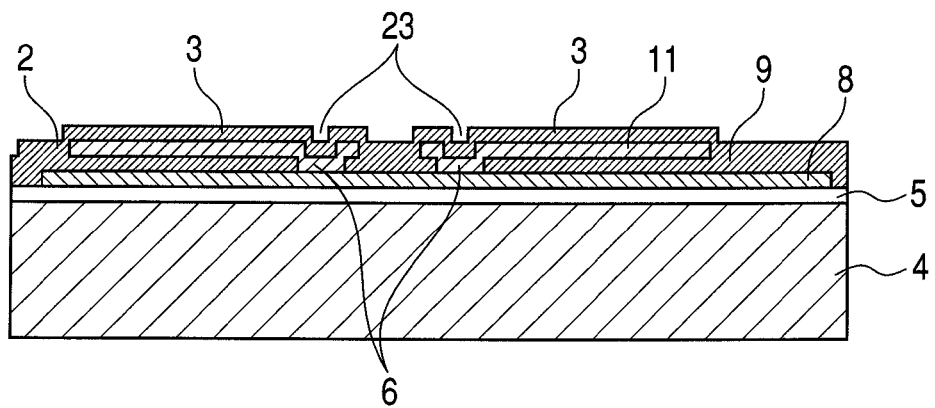
Figure 2H:
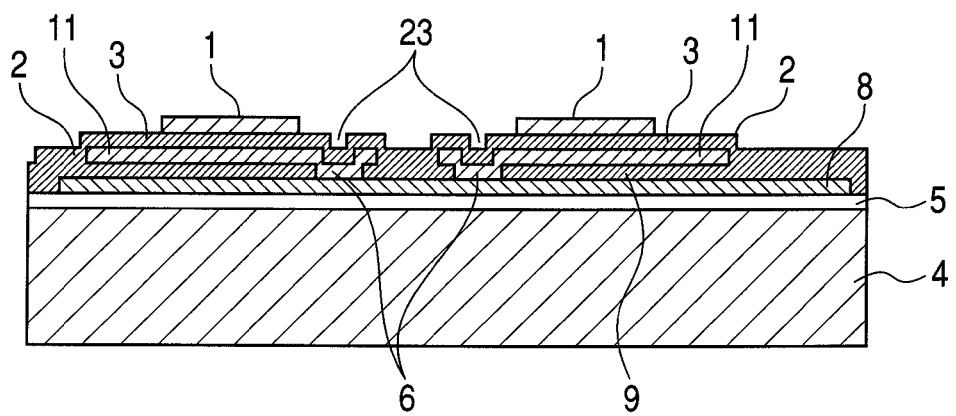
Figure 2I:
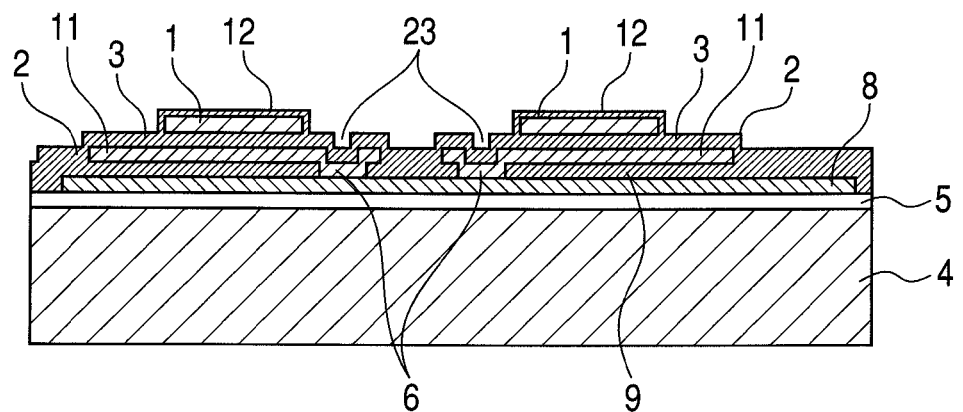
Figure 2J:
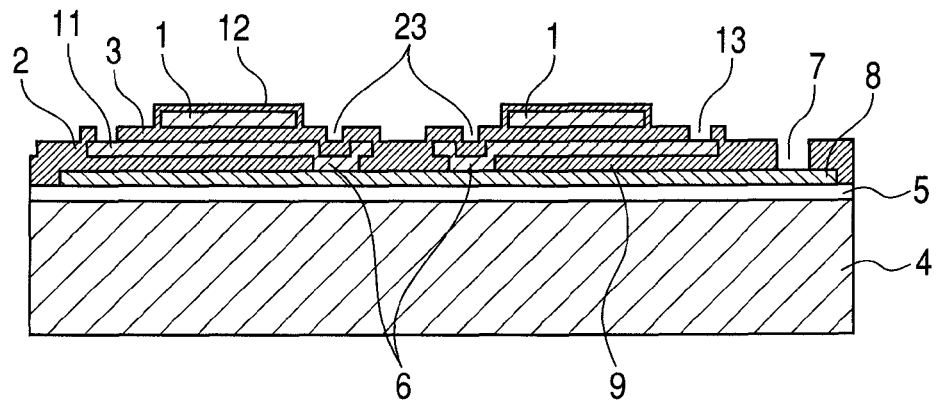
Figure 2K:
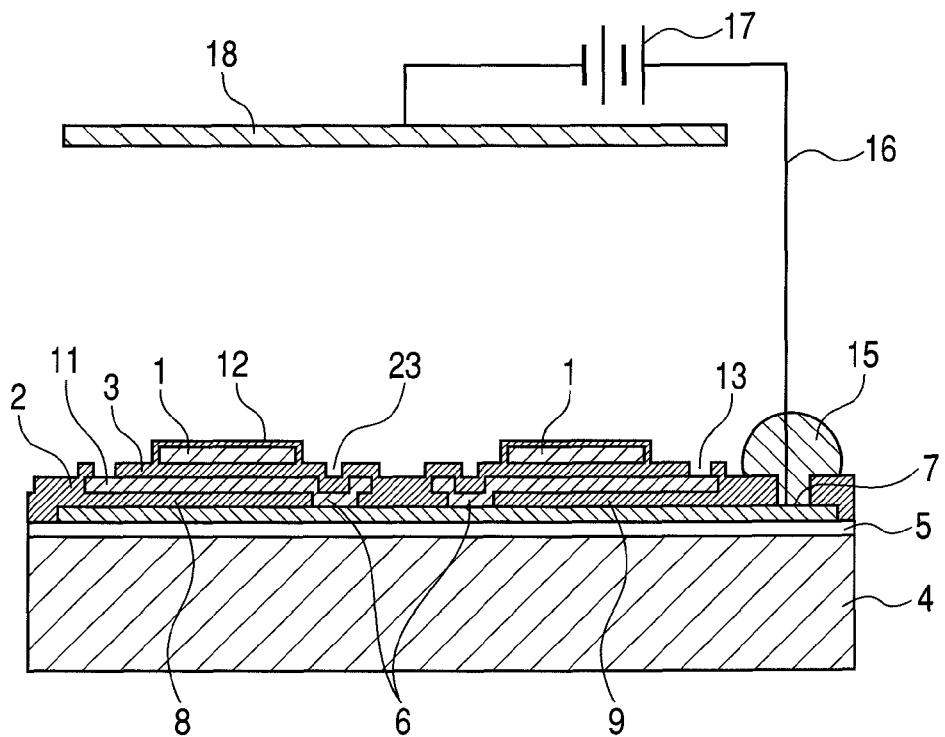
Figure 2L:
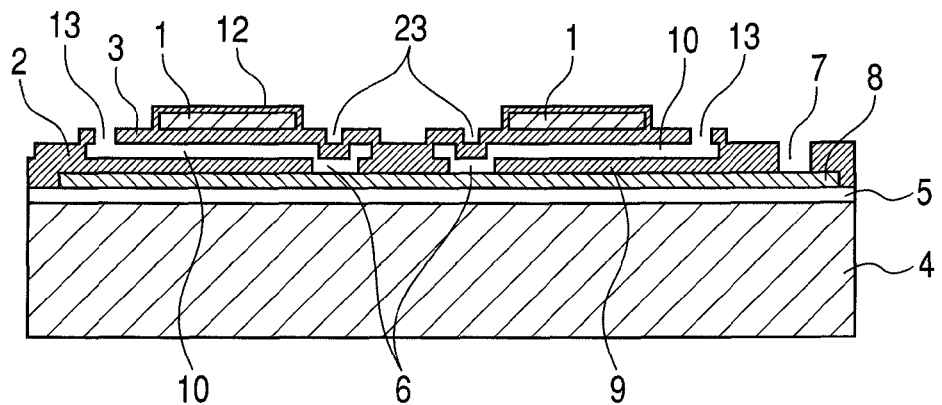
Figure 2M:
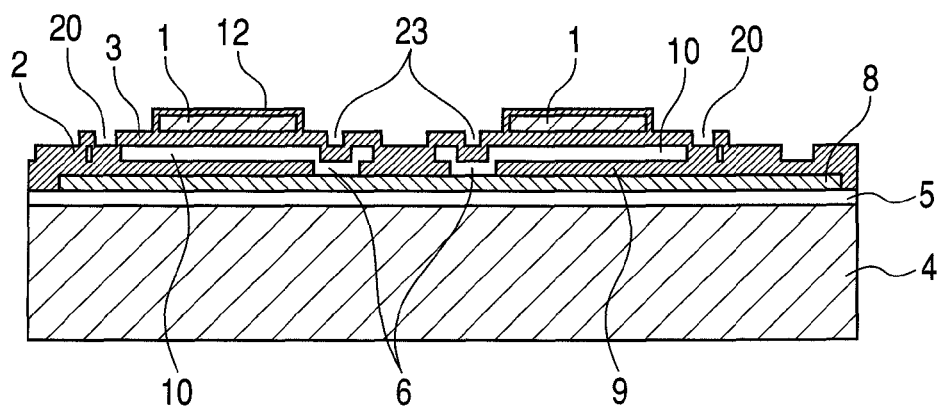
Figure 2N:
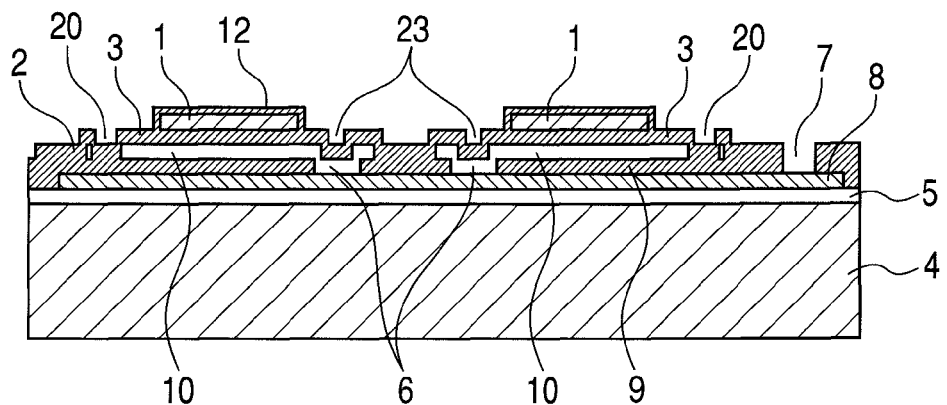

FIGS. 2A to 2N are sectional views for describing steps of a capacitive electromechanical transducer manufacturing method according to a first embodiment of the present invention. For the sake of simplifying the following description, "patterning process" refers to all process steps from the photolithography process including the application of photoresist onto a substrate, drying, exposure, and development, to the etching process, the removal of the photoresist, the substrate washing, and drying process, which are executed in the stated order. This embodiment takes as an example a case in which a substrate 4 is Si, but other materials may be employed for the substrate. For example, an $SiO_2$ substrate or a sapphire substrate can be used.

First, in the manufacturing method of this embodiment, the Si substrate 4 is prepared and washed as illustrated in FIG. 2A. Next, as illustrated in FIG. 2B, the substrate 4 is put in a thermal oxidization furnace to form an Si oxide film, which forms a first insulating film 5. In order to keep parasitic capacitance in the electromechanical transducer low, the thickness of the first insulating film 5 (Si oxide film) is desirably 100 nm or thicker, more desirably, 500 nm or thicker, and most desirably, 2,000 nm or thicker. The Si oxide film forming the first insulating film 5 may be replaced by other insulating methods. For example, a nitride film may be formed or a PN junction well for reverse bias may be set.

A doped polycrystalline Si film is formed on the first insulating film 5 (Si oxide film) by low pressure chemical vapor deposition (LPCVD) as illustrated in FIG. 2B. The doped polycrystalline Si film serves as a lower electrode 8, which is a first electrode of this transducer. The lower electrode 8 is electrically insulated from the substrate 4 by the first insulating film 5. The potential drop of the lower electrode 8 is desirably reduced in order to steadily keep the etching rate constant at a high level during the electrolytic etching of a sacrificial layer in a later step. The sheet resistance of the lower electrode 8 is therefore desirably 20.0Ω/or lower, more desirably, 5.0Ω/or lower, and most desirably, 1.0Ω/or lower. In this embodiment, the lower electrode 8 which is the first electrode is thus a conductive film formed on a surface of the substrate.

Next, as illustrated in FIG. 2C, the lower electrode (doped polycrystalline Si) is patterned by dry etching with the use of $CF_4$ gas plasma or chlorine gas plasma.

Next, as illustrated in FIG. 2D, an $Si_3N_4$ film is formed as a second insulating film 9 by LPCVD, or plasma enhanced chemical vapor deposition (PECVD), or the sputtering method. The material of the lower electrode 8 is not limited to doped polycrystalline Si, and may be other low resistance materials. Examples of other options include a doped single crystal Si substrate, a single crystal Si substrate that has a doped well region as a lower electrode, doped amorphous Si, oxide semiconductor, and metal that allows selective etching with respect to a sacrificial layer 11 described later (for example, etch-resistant metal).

Next, as illustrated in FIG. 2E, the $Si_3N_4$ film serving as the second insulating film 9 is patterned by dry etching with the use of $CF_4$ gas plasma, to thereby form an opening 6 in the second insulating film 9, which leads to the lower electrode 8. The opening 6 is placed on an end of a cavity described later in this embodiment, but other arrangements may be employed as described later.

Next, the sacrificial layer 11 is formed and patterned as illustrated in FIG. 2F. Potential drop in the sacrificial layer 11 is desirably reduced in order to steadily keep the etching rate constant during the subsequent electrolytic etching of the sacrificial layer 11. Taking into account the dimensions of a transducer that can be manufactured by the current micromachining technology, the resistivity of the sacrificial layer 11 is desirably $10^{-1} \Omega^{-cm}$ or lower, more desirably, $10^{-3} \Omega^{-cm}$ or lower, and most desirably, $10^{-5} \Omega^{-cm}$ or lower. Metal is therefore a favorable material of the sacrificial layer 11.

This embodiment uses as the sacrificial layer 11 a Cu film formed by the sputtering method. The Cu film is patterned by wet etching. A Cu etchant that can be used in this patterning is one containing $FeCl_3$ (for example, CE-200 etchant manufactured by Transene Company, Inc.) or one containing $(NH_4)_2S_2O_8$ (for example, ASP-100 etchant manufactured by Transene Company, Inc.). In order to enhance the adhesion of the sacrificial layer 11, it is desirable to form a Ti film which has a thickness of about 2 nm to 15 nm immediately before the Cu film is formed.

The thickness of the sacrificial layer 11 determines the final inter-electrode distance (distance between the lower electrode 8 and an upper electrode described below) of this transducer. As the sacrificial layer 11 becomes thinner, the electromechanical transduction coefficient of the transducer becomes higher. However, too short inter-electrode distance increases a fear of breakdown. Therefore, the thickness of the sacrificial layer 11 is desirably from 5 nm to 4,000 nm, more desirably, from 10 nm to 1,000 nm, and most desirably, from 20 nm to 500 nm.

Next, as illustrated in FIG. 2G, an $Si_3N_4$ film is formed as a membrane 3 by PECVD. A membrane supporter 2 and a concave portion 23 of the membrane 3 are formed at the same time when the membrane 3 is formed, because of level differences provided by the opening 6 and the sacrificial layer 11. It can be seen in FIG. 2G that the concave portion 23 of the membrane 3 is formed right above the opening 6 without exception. In the case where the membrane 3 is of a dielectric substance, at least one type may be chosen from among dielectric materials such as $Si_xN_Y$ films, $Si_xO_Y$ films, $SiN_xO_Y$ films, $Y_2O_3$, HfO, and HfAlO to be used for the membrane 3.

As illustrated in FIG. 2H, an upper electrode 1 is formed on the membrane 3 and patterned. In this embodiment, the upper electrode 1 is a film formed from one type of material chosen from among metal, low resistance amorphous Si, and low resistance oxide semiconductors.

Next, as illustrated in FIG. 2I, an $Si_3N_4$ film is formed as a third insulating film 12 by plasma enhanced chemical vapor deposition (PECVD). The third insulating film 12 is formed in order to protect the transducer. Accordingly, the $Si_3N_4$ film serving as the third insulating film 12 may be replaced by an $SiO_2$ film, an $SiO_xN_y$, polymer resin film (for example, polydimethyl siloxane (PDMS) film or a parylene film), or the like.

Next, as illustrated in FIG. 2J, the $Si_3N_4$ films serving as the membrane 3, the second insulating film 9, and the third insulating film 12 are etched by dry etching with the use of $CF_4$ gas plasma. An etchant inlet 13 which is an aperture of the membrane 3, and a pad 7 of the lower electrode 8, are thus formed. With $CF_4$ gas plasma, minute dry etching is possible and the pad 7 of the lower electrode 8 can be formed without damaging the lower electrode 8. The etchant inlet 13 is formed by $CF_4$ gas plasma etching with the sacrificial layer 11 as an etching stopper layer.

Next, as illustrated in FIG. 2K, an electric coupler 15 is provided on the pad 7 of the lower electrode 8 with the use of a conductive epoxy resin or by bonding. The outer surface of the electric coupler 15 is covered with a silicone resin to be insulated from the outside. A voltage source 17 then applies a voltage between a counter electrode 18 (cathode) and the lower electrode 8 in an electrolytic etchant via electric wiring 16. A favorable material of the counter electrode 18 is Pt, Ni, C, or the like. The sacrificial layer 11 is at this point electrically connected to the lower electrode 8 through the opening 6. The potential drop in the sacrificial layer 11 (Cu), which is a low resistance material, is relatively small. The potential of the sacrificial layer 11 and the potential of the lower electrode 8 therefore have approximately the same value. An electric circuit in which the sacrificial layer 11 and the lower electrode 8 are anodes and the counter electrode 18 is a cathode is thus established.

Note that FIG. 2K is simplified by omitting parts that are usually used to stabilize electrolytic etching conditions, such as a reference electrode, an ampere meter, a voltmeter, a coulometer, and a variable resistor.

After the above-mentioned circuit structure is built, an electrolytic etching reaction starts from the etchant inlet 13 while the transducer is immersed in the electrolytic etchant as illustrated in FIGS. 2K and 2L. In the case where the sacrificial layer 11 is thin and etched by wet etching without using electrolytic reaction, diffusion-limited control stops the etching immediately. According to the electrolytic etching method of this embodiment, however, the sacrificial layer 11 (Cu) down to the opening 6, which leads to the lower electrode 8, can be removed in a relatively short period of time. An example of the electrolytic etchant conditions is illustrated in Table 1 below:

TABLE 1

| Component | Composition |
|---|---|
| $Cu(NO_3)_2 \cdot 2.5H_2O$ | 0.5 g |
| $NH_4OH$ (concentration: 14.8N) | 20 ml |
| $H_2O$ | 30 ml |

The above-mentioned electrolytic etchant may be replaced by other neutral electrolysis solutions, for example, an NaCl solution.

In order to reduce bubbles generated in the process of the electrolytic etching, the mean voltage value of the voltage applied by the voltage source 17 between the sacrificial layer 11 and the counter electrode 18 is desirably from 1 V to 10 V, and more desirably, from 3 V to 5 V. The frequency of this voltage is desirably from DC to 10 MHz, and more desirably, from 100 Hz to 100 kHz.

In order to prevent the re-deposition of the sacrificial layer 11, the lowest value of the voltage applied between the sacrificial layer 11 and the counter electrode 18 is desirably −2 V or higher, and more desirably, 0 V or higher.

After the above-mentioned electrolytic etching is completed, the substrate is washed with deionized water and dried. The voltage source 17 may be removed at this stage as well as the electric coupler 15 and a part of the electric wiring 16, or may be left in place in the case where the subsequent steps do not include a process performed at 200° C. or higher. This embodiment describes a case in which the electric coupler 15 and a part of the electric wiring 16 are removed.

Next, as illustrated in FIG. 2M, an $Si_3N_4$ film is formed by PECVD. This $Si_3N_4$ film seals the etchant inlet 13 to form a sealing portion 20. The sealing process may instead use at least one type of a film chosen from among nitride films, oxide films, oxynitride films, and polymer resin films that are formed by CVD or physical vapor deposition (PVD). The film by this process can be considered as a part of the third insulating film 12.

The sealing portion 20 seals a cavity 10, and therefore, the thickness of the sealing $Si_3N_4$ film is desirably half the thickness of the sacrificial layer 11 or thicker, and more desirably, equal to or thicker than the thickness of the sacrificial layer 11. The cavity 10 that is tightly sealed is formed through this sealing process.

The pressure in the PECVD process is usually from 0.1 Torr to several tens Torr. In the case of sealing with an $Si_3N_4$ film that is formed by PECVD, the atmospheric pressure presses the membrane 3 downward and deforms the membrane 3 into a concave shape. The stress on the $Si_3N_4$ film formed by PECVD can be adjusted by the ignition electrode placement, discharge frequency, gas composition, and temperature of a PECVD film formation apparatus. When this stress is of compression property, there is a possibility that the membrane 3 is given a convex shape. The membrane 3 illustrated in FIG. 2M is level.

The sealing $Si_3N_4$ film may be replaced with an $SiO_2$ film, an $SiO_xN_y$ film, or a polymer resin film. In particular, a polymer resin film, for example, a polydimethylsiloxane film (PDMS film) or a paylene film can be formed at low temperature and therefore allows the electric coupler 15 and a part of the electric wiring 16 to remain in place.

Lastly, the pad 7 of the lower electrode 8 is patterned again as illustrated in FIG. 2N, whereby the capacitive electromechanical transducer manufacturing process of this embodiment is completed. A pad of the upper electrode 1, which is also formed by patterning at this point, is not illustrated in FIG. 2N in order to simplify FIG. 2N.

The description of this embodiment is simplified by using insulating $Si_3N_4$ films for all of the membrane 3 of FIG. 2G, the third insulating film 12 of FIG. 2I, and the sealing film of FIG. 2M which forms the sealing portion 20. When the same insulating material is used for the membrane 3 and the third insulating film 12, the membrane 3 and the third insulating film 12 which are integrated can be considered as a membrane as a whole.

Figure 7A:
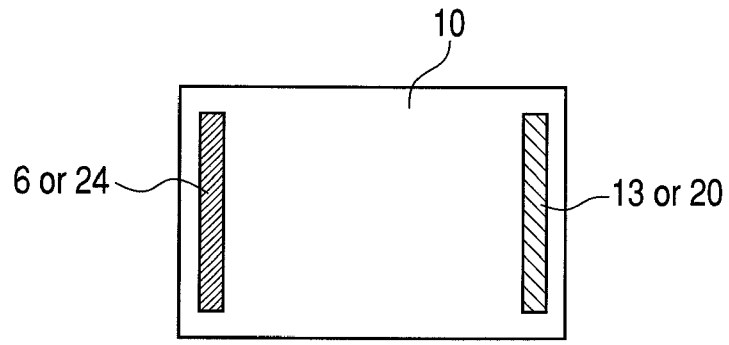
FIGS. 7A and 7B are perspective plan views illustrating structural examples of a capacitive electromechanical transducer according to an embodiment of the present invention.

FIG. 7A is a perspective plan view illustrating a structural example of the capacitive electromechanical transducer of this embodiment manufactured by the above-mentioned manufacturing method. The cavity 10 illustrated in FIG. 7A is rectangular, but the cavity 10 may instead have a square, circular, or polygonal shape. In either case, in this embodiment, the opening 6 of the second insulating film 9 which leads to the lower electrode 8 is placed on one end of the cavity and the etchant inlet 13 or the sealing portion 20 is placed on the other end of the cavity. A contact point between the anode (lower electrode 8) and the sacrificial layer 11 is positioned farthest or far enough from the etchant inlet (or inlet group), and hence etching progresses uniformly throughout the entire sacrificial layer.

Figure 7B:
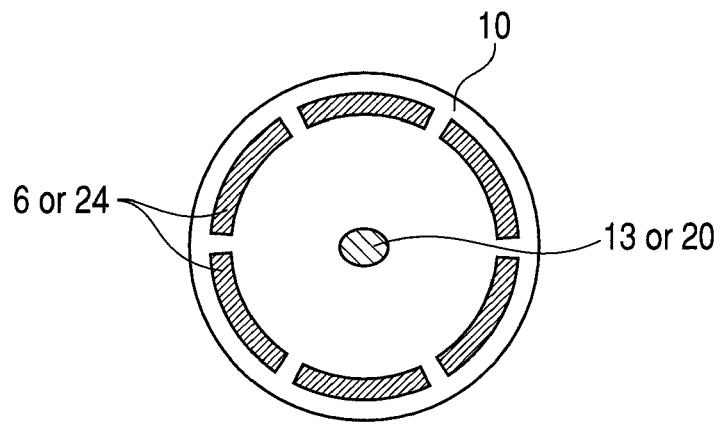
Figure 8:
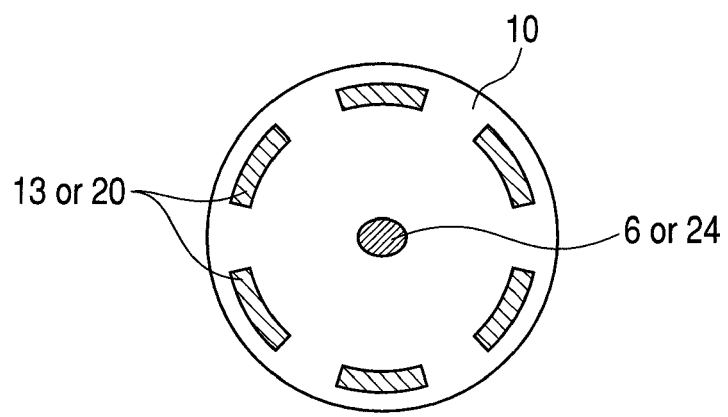
FIG. 8 is a perspective plan view illustrating a structural example of a capacitive electromechanical transducer according to an embodiment of the present invention.

FIG. 7B and FIG. 8 are perspective plan views illustrating structural examples of the capacitive electromechanical transducer of this embodiment when the cavity 10 is circular. In the example of FIG. 7B, the etchant inlet 13 or the sealing portion 20 is placed in the center of the cavity and the opening 6 of the second insulating film 9 which leads to the lower electrode 8 is placed across form the periphery of the cavity. This placement is reversed in the example of FIG. 8. In those examples, the opening 6 of the second insulating film 9 or the etchant inlet 13 which is positioned along the periphery of the cavity 10 is not limited to the number and shape illustrated in FIG. 7B and FIG. 8, and should be designed to be suited to individual cases.

Figure 9A:
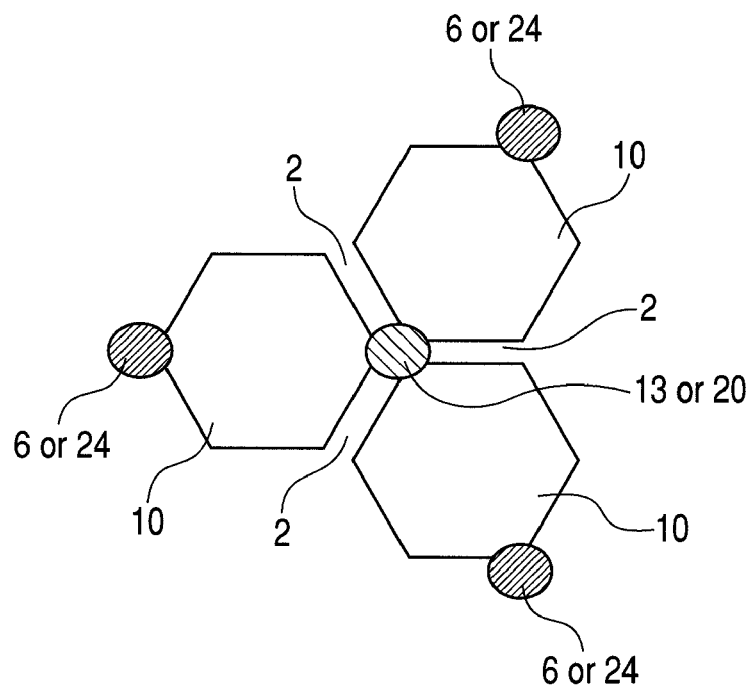
FIGS. 9A and 9B are perspective plan views illustrating structural examples of a capacitive electromechanical transducer with multiple transducer portions according to an embodiment of the present invention, in which cavities are arranged in an array.
Figure 9B:
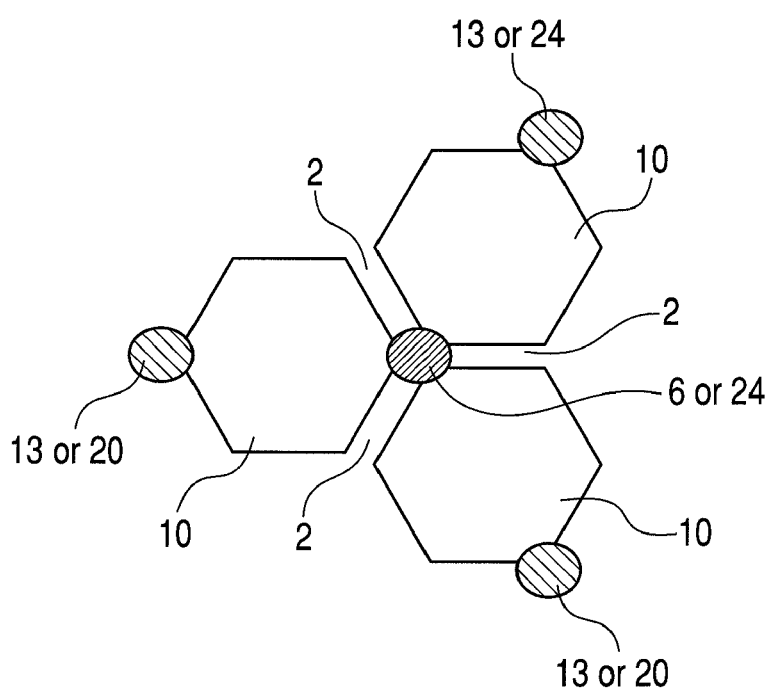

FIGS. 9A and 9B are perspective plan views illustrating structural examples in which the above-mentioned capacitive electromechanical transducer forms a transducer portion and multiple transducer portions are arranged into an array. Here, three adjacent cavities 10 are illustrated. In the example of FIG. 9A, the etchant inlet 13 or the sealing portion 20 is placed at the center of the structure so that the etchant inlet 13 or the sealing portion 20 is shared, and the opening 6 of the second insulating film 9 which leads to the lower electrode 8 is placed for each cavity 10 at a point farthest from the center of the structure. This placement is reversed in FIG. 9B.

In the example of FIG. 9A, the sacrificial layers 11 of the multiple transducer portions are etched in the manufacturing process by electrolytic etching through the shared etchant inlet 13. In the example of FIG. 9B, the sacrificial layers 11 of the multiple transducer portions are etched in the manufacturing process by electrolytic etching through their respective etchant inlets 13, whereas the opening 6 in the second insulating film 9 which leads to the lower electrode 8 is shared by the three.

According to the manufacturing method of this embodiment, in which openings or apertures are formed at a sufficient distance, a thin sacrificial layer can be etched at relatively high speed by electrolytic etching without depending on diffusion-limited control and without increasing the size and number of openings or apertures considerably. Thin cavities can thus be formed in a favorable manner. More specifically, the etching rate can steadily be kept constant, or constant at a high level, via the anode voltage of the first electrode.

Second Embodiment

Figure 3A:
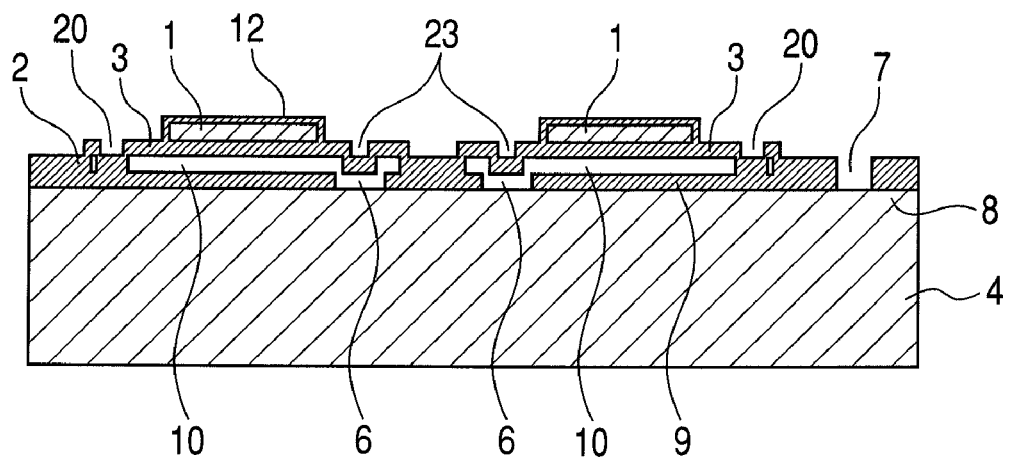
FIG. 3A is a sectional view illustrating a structure of a capacitive electromechanical transducer according to a second embodiment of the present invention.

FIG. 3A is a sectional view illustrating a capacitive electromechanical transducer according to a second embodiment of the present invention. In this embodiment, the substrate 4 serves as the lower electrode 8. A manufacturing process of the transducer of this embodiment is mostly the same as that of the first embodiment, but is simpler since the lower electrode 8 (first electrode) and first insulating film 5 of the first embodiment are not installed.

In this embodiment where the substrate 4 itself serves as the lower electrode 8, the serial resistance in the transducer circuit should be lowered in order to raise the detected current of the transducer. Therefore, the sheet resistance of the substrate 4 serving as the lower electrode 8 is desirably 1.0Ω/or lower, more desirably, 0.1Ω/or lower, most desirably, 0.02Ω/or lower. FIG. 3A does not illustrate a specific region that serves as the lower electrode 8. This substrate 4 can be etched by deep reactive ion etching (DRIE) for the electric isolation of the transducer. In this embodiment, a substrate that is low resistant at least on the surface thus serves as the first electrode as well.

While FIG. 3A illustrates an example in which the pad 7 of the lower electrode 8 is placed by the cavity 10, the pad 7 of the lower electrode 8 may be placed on the rear surface of the substrate 4. The rest is the same as in the first embodiment.

Third Embodiment

Figure 3B:
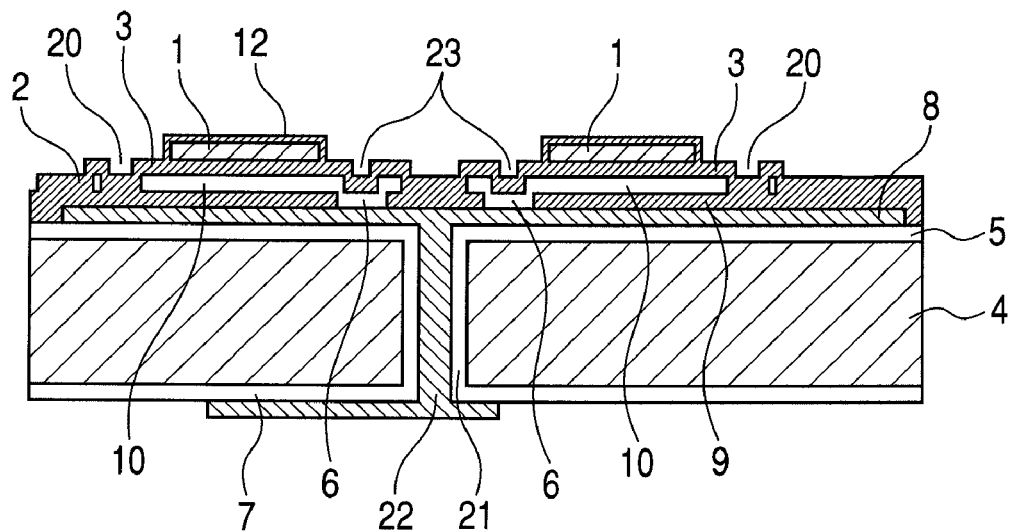
FIG. 3B is a sectional view illustrating a structure of a capacitive electromechanical transducer according to a third embodiment of the present invention.

FIG. 3B is a sectional view illustrating the structure of a capacitive electromechanical transducer according to a third embodiment of the present invention. In this embodiment, a through wiring conductive portion 22 which pierces the substrate 4 is provided. A manufacturing process of the transducer of this embodiment is mostly the same as that of the first embodiment.

An insulating portion 21 of the through wiring conductive portion 22 can be formed by the same way as the first insulating film 5, which is formed by thermal oxidization. The through wiring conductive portion 22 can be formed from doped polycrystalline Si by LPCVD similarly to the lower electrode 8. The pad 7 of the lower electrode 8 can therefore be led out to the rear surface of the substrate 4 as illustrated in FIG. 3B.

While FIG. 3B illustrating this embodiment illustrates a mode in which the through wiring conductive portion 22 is connected to the lower electrode 8, a different wiring mode may be employed in which the through wiring conductive portion 22 is not in contact with the lower electrode 8 but is connected to the upper electrode 1. The rest is the same as in the first embodiment.

Fourth Embodiment

Figure 4A:
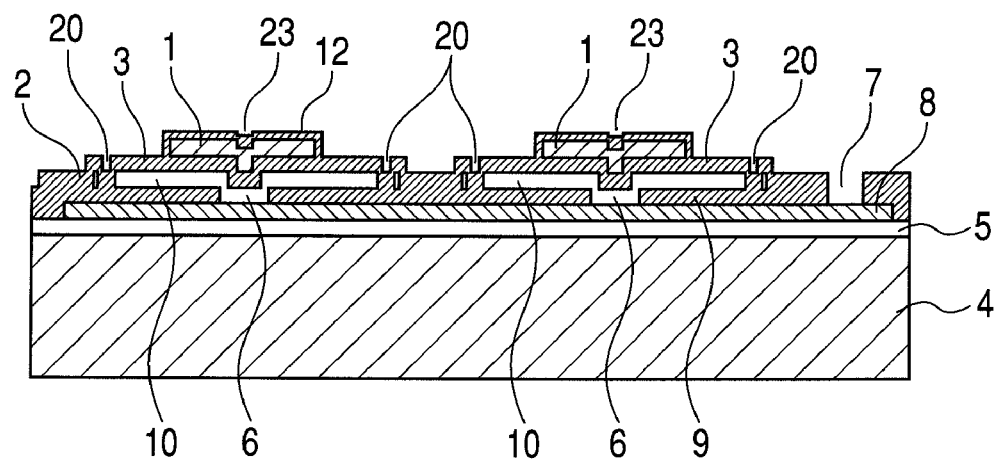
FIG. 4A is a sectional view illustrating a structure of a capacitive electromechanical transducer according to a fourth embodiment of the present invention.

FIG. 4A is a sectional view illustrating the structure of a capacitive electromechanical transducer according to a fourth embodiment of the present invention. In this embodiment, the opening 6 in the second insulating film 9 which leads to the lower electrode 8 is at the center of the cavity 10 and the sealing portion 20 or the etchant inlet is on the periphery of the cavity 10. A manufacturing process of the transducer of this embodiment is mostly the same as that of the first embodiment.

It can be seen in FIG. 4A illustrating this embodiment that the concave portion 23 of the membrane 3 (including the protective film 12) is naturally formed right above the opening 6 in the second insulating film 9 which leads to the lower electrode 8.

FIG. 8 is a perspective plan view illustrating a structural example of the capacitive electromechanical transducer of this embodiment. In this example, the sealing portion 20 or the etchant inlet 13 which is placed on the periphery of the cavity 10 is not limited to the number and shape illustrated in FIG. 8, and should be designed to suit individual cases. The rest is the same as in the first embodiment.

Fifth Embodiment

Figure 4B:
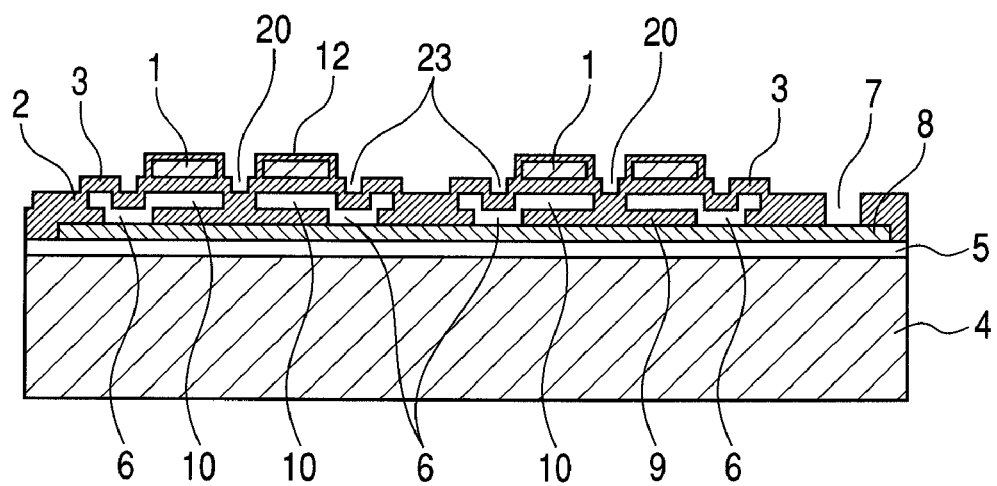
FIG. 4B is a sectional view illustrating a structure of a capacitive electromechanical transducer according to a fifth embodiment of the present invention.

FIG. 4B is a sectional view illustrating the structure of a capacitive electromechanical transducer according to a fifth embodiment of the present invention. In this embodiment, the opening 6 of the second insulating film 9 which leads to the lower electrode 8 is on the periphery of the cavity 10 and the sealing portion 20 or the etchant inlet is at the center of the cavity 10. A manufacturing process of the transducer of this embodiment is mostly the same as that of the first embodiment.

FIG. 7B is a perspective plan view illustrating a structural example of the capacitive electromechanical transducer of this embodiment. In this example, the opening 6 in the second insulating film 9 which is placed on the periphery of the cavity 10 is not limited to the number and shape illustrated in FIG. 7B, and should be designed to suit individual cases. The rest is the same as in the first embodiment.

Sixth Embodiment

FIG. 5A is a sectional view illustrating the structure of a capacitive electromechanical transducer according to a sixth embodiment of the present invention. In this embodiment, the sealing portion 20 or the etchant inlet is placed on one end of the cavity 10, and an opening 24 which leads to the upper electrode 1 is placed on the other end of the cavity 10. When forming the opening 24, which leads to the upper electrode 1, on the side of the membrane 3, the opening 24 is patterned by the same patterning process that is employed for the nitride film constituting the second insulating film 9 of the first embodiment.

In the structure of this embodiment, too, a pad 14 of the upper electrode 1 is electrically coupled to the upper electrode 1, which makes electrolytic etching through the upper electrode pad 14 possible. Electric wiring between the upper electrode 1 and the upper electrode pad 14 is not illustrated in FIG. 5A in order to simplify the drawing.

The lower electrode 8 of this embodiment is covered with the second insulating film 9. The sealing portion 20 in this embodiment is a portion where the etchant inlet 13 is sealed as in the first embodiment. The rest is the same as in the first embodiment.

Seventh Embodiment

FIG. 5B is a sectional view illustrating the structure of a capacitive electromechanical transducer according to a seventh embodiment of the present invention. In this embodiment, the opening 24 in the membrane 3 which leads to the upper electrode 1 is at the center of the cavity 10. A manufacturing process of the transducer of this embodiment is mostly the same as that of the sixth embodiment. FIG. 5B, too, does not illustrate electric wiring between the upper electrode 1 and the upper electrode pad 14 in order to simplify the drawing.

FIG. 8 is a perspective plan view illustrating a structural example of the capacitive electromechanical transducer of this embodiment. In this example, the sealing portion 20 or the etchant inlet 13 which is placed on the periphery of the cavity 10 is not limited to the number and shape illustrated in FIG. 8, and should be designed to suit individual cases. The rest is the same as in the first embodiment.

Eighth Embodiment

Figure 6:
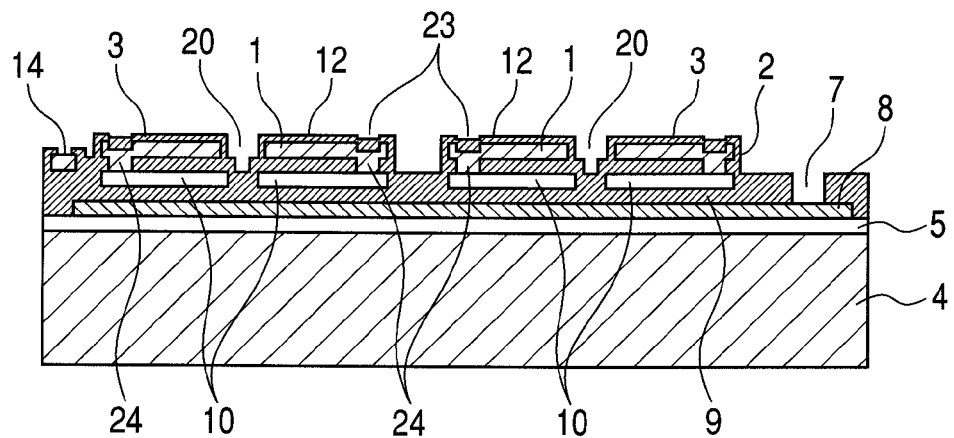
FIG. 6 is a sectional view illustrating a structure of a capacitive electromechanical transducer according an eighth embodiment of to the present invention.

FIG. 6 is a sectional view illustrating the structure of a capacitive electromechanical transducer according to an eighth embodiment of the present invention. In this embodiment, the opening 24 in the membrane 3 which leads to the upper electrode 1 is on the periphery of the cavity 10. A manufacturing process of the transducer of this embodiment is mostly the same as that of the sixth embodiment. FIG. 6, too, does not illustrate electric wiring between the upper electrode 1 and the upper electrode pad 14 in order to simplify the drawing.

FIG. 7B is a perspective plan view illustrating a structural example of the capacitive electromechanical transducer of this embodiment. In this example, the opening 24 in the membrane 3 which is placed on the periphery of the cavity 10 and leads to the upper electrode 1 is not limited to the number and shape illustrated in FIG. 7B, and should be designed to suit individual cases. The rest is the same as in the first embodiment.

Although FIGS. 1 to 6 described above illustrate the structure around the cavities 10 of two adjacent transducer portions, a large-area transducer array can also be manufactured in each embodiments by arranging regularly or periodically on the substrate the transducer portions of the respective structural principles illustrated in those diagrams. The structure and manufacturing method of the array are essentially the same as those described above, and are obvious from the above-mentioned description.

FIGS. 9A and 9B are similarly perspective plan views of structural examples illustrating the cavities 10 of three adjacent transducer portions. In those structural examples, too, a large-area transducer array is manufactured by arranging regularly or periodically on the substrate the transducer portions of the respective structural principles illustrated in the above-mentioned diagrams.

The vibrating portion in the above-mentioned embodiments is a laminate film containing the membrane 3, the upper electrode 1, the third insulating film 12, the sealing film, and others. While the protective film 12, for example, is described in the above-mentioned embodiments as a separate film from the membrane 3 for the ease of description, in practice, a film just below the upper electrode 1 may be regarded as an insulating film, with the third insulating film 12 and others as part of the membrane 3. It is therefore possible to reverse the spatial arrangement of the membrane 3 and the third insulating film 12 in the description. For instance, the reference symbol 3 in FIGS. 3A and 3B may denote the third insulating film while the reference symbol 12 in FIGS. 3A and 3B denotes the membrane.

Ninth Embodiment

FIGS. 10A and 10B are perspective plan views illustrating structural examples of a capacitive electromechanical transducer according to a ninth embodiment of the present invention. Here, the cavities 10 of transducer portions are arranged into an array and a connection port 25 is provided between adjacent cavities 10. In other words, a structure in which a connection port connects a first cavity and a second cavity is contained.

As illustrated in FIGS. 10A and 10B, the sealing portion 20 or the etchant inlet 13 is placed at one end of the transducer array whereas the insulating layer opening 6 or 24 is placed at the other end of the transducer array, and apertures or the connection ports 25 are formed in the membrane supporters 2 of the transducer portions.

According to this embodiment, an etchant passage from the etchant inlet 13 to the insulating film opening 6 or 24, which leads to an electrode (anode), is established either when transducer portions are arranged on a substrate in parallel (the example of FIG. 10A) or when arranged in series (the example of FIG. 10B). The sacrificial layer can thus be etched steadily at high speed. The resultant effects are, for example, a reduction in number of apertures formed in the membrane 3 and accordingly more stable mechanical characteristics of the capacitive electromechanical transducer.

In manufacturing a large-area transducer array, the arrangement of multiple transducer portions is not limited to the arrangement examples of FIGS. 10A and 10B, and transducer portions can be arranged flexibly to suit individual cases. The rest is the same as in the first embodiment.

Tenth Embodiment

Figure 11A:
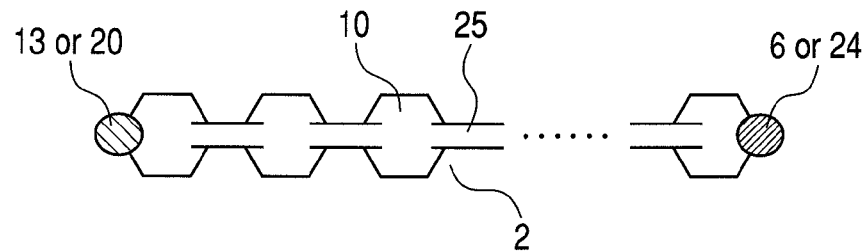
FIGS. 11A, 11B and 11C are perspective plan views illustrating structural examples of the capacitive electromechanical transducer with multiple transducer portions according to the tenth embodiment of the present invention, in which cavities are arranged in an array and a connection port is provided between adjacent cavities.
Figure 11B:
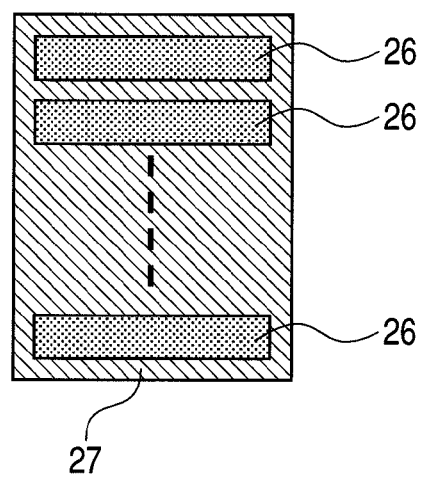
Figure 11C:
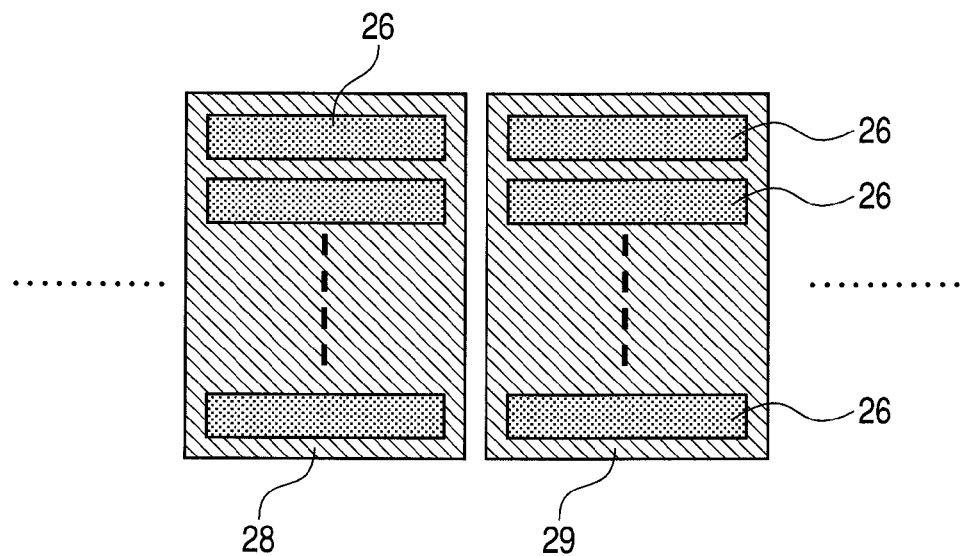

FIGS. 11A to 11C are perspective plan views illustrating structural examples of a capacitive electromechanical transducer according to a tenth embodiment of the present invention. FIG. 11A illustrates a structure in which multiple cavities 10 of transducer portions are arranged in a single row and the connection port 25 is provided between adjacent cavities 10 as in the ninth embodiment. In other words, a structure in which a connection port connects a first cavity and a second cavity is contained. Differences from the ninth embodiment are that there are more adjacent cavities per row than in the ninth embodiment, and that multiple cavity rows 26 each including those multiple cavities are formed adjacent to one another.

As illustrated in FIG. 11A, the sealing portion 20 or the etchant inlet 13 is placed at one end of the transducer array whereas the insulating layer opening 6 or 24 is placed at the other end of the transducer array, and apertures or the connection ports 25 are formed in the membrane supporters 2 of the transducer portions.

As illustrated in FIG. 11B, the cavity rows 26 each having cavities that are linked by the above-mentioned connection flow path can be arranged in parallel to one another.

In designing a transducer, an aggregation of the cavity rows 26 that are arranged in parallel as illustrated in FIG. 11B is called a single-element 27. Upper electrodes of transducers constituting a single-element are made electrically common to one another and lower electrodes of the transducers are similarly made common to one another. Structured as this, the single-element acts as a single pixel in an ultrasonic image. Such elements are two-dimensionally arranged into multiple rows to form an ultrasonic image with electric signals obtained from the aggregation of elements. In FIG. 11B, it is preferable that each single-aggregation 26 which is a group of multiple cavities linked by the above-mentioned connection ports (also referred to as flow path) use the flow path individually. However, it is also possible to build a common flow path throughout a single element by connecting adjacent cavity rows 26 with a connection port.

FIG. 11C is a conceptual diagram in which the single-elements of FIG. 11B are arranged into an array, with an n-th element 28 and an (n+1)-th element 29 disposed two-dimensionally. The present invention is further capable of a 3D (three-dimensional) ultrasonic image formed from element arrays.

In manufacturing a large-area transducer array, the arrangement of multiple transducer portions is not limited to the arrangement examples of FIGS. 11A to 11C, and an arbitrary arrangement can be employed to suit the need.

Eleventh Embodiment

Figure 12A:
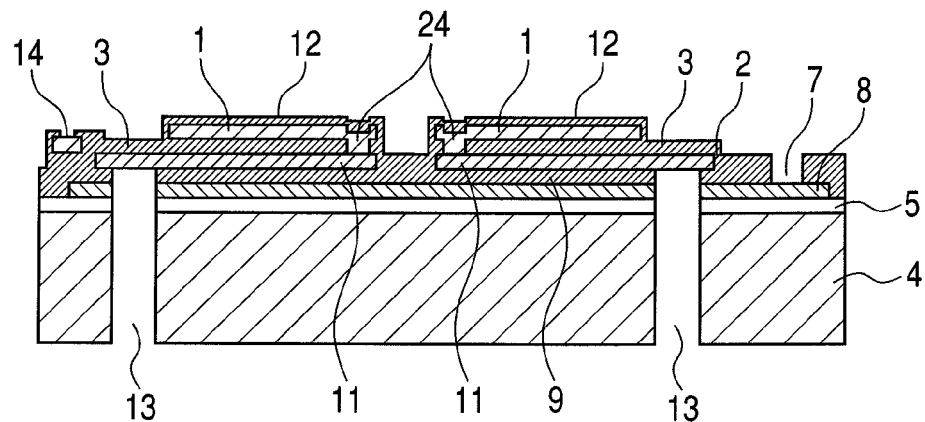
FIGS. 12A, 12B and 12C are sectional views illustrating a structure of a capacitive electromechanical transducer according to an eleventh embodiment of the present invention, in which an etchant inlet is provided by piercing the rear surface of a substrate.
Figure 12B:
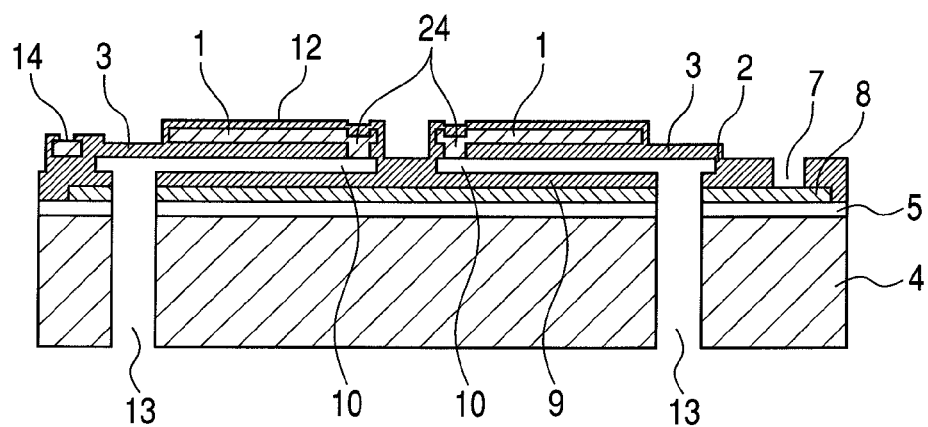
Figure 12C:
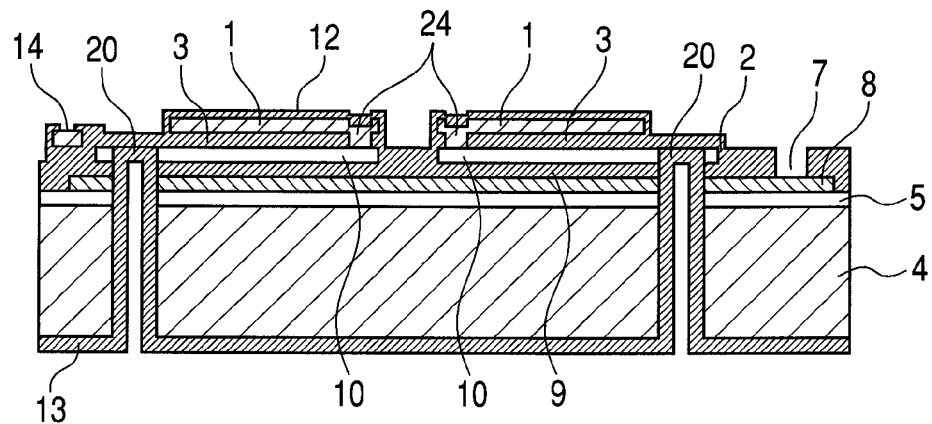

FIGS. 12A to 12C are sectional views illustrating the structure of a capacitive electromechanical transducer according to an eleventh embodiment of the present invention.

This embodiment illustrates an example in which the etchant inlet 13 is provided in a piercing manner to reach the sacrificial layer from the rear surface of the substrate.

In a manufacturing process of the transducer of this embodiment, the first manufacturing process step illustrated in FIG. 12A is the same as FIG. 5A of the sixth embodiment, except that, before the sacrificial layer 11 is removed, the etchant inlet 13 is formed from the rear surface of the substrate 4 by deep reactive ion etching (RIE).

The etchant inlet 13 is formed by etching the substrate 4 (for example, Si wafer) with $SF_6$ gas plasma and stopping the etching with the first insulating film (for example, thermal oxide film 5) used as an etching stopper layer. Plasma etching with the use of $CHF_3$ gas, $CF_4$ gas, or the like is then performed to etch the first insulating film (for example, thermal oxide film 5), the lower electrode (for example, Si heavily doped with an impurity), and the second insulating film (for example, $Si_3N_4$ film) until the sacrificial layer (for example, Cu) is reached.

The subsequent steps are the same as those in the first embodiment, and the sacrificial layer 11 is removed by electrolytic etching through the etchant inlet 13 and dried as illustrated in FIG. 12B.

In performing the electrolytic etching process, the upper electrode 1 is connected to an anode of a power supply (potentiostat) via the upper electrode pad 14. The substrate 4 is then immersed in the above-mentioned electrolytic etchant, and the electrolytic etchant flows into the etchant inlet 13 by deep RIE from the rear surface of the substrate 4. Thereafter, a current is caused to flow between the upper electrode 1 and the counter electrode, which is in contact with the electrolytic etchant on the outside, and the sacrificial layer 11 in contact with the upper electrode 1 is etched by electrolytic etching.

The lower electrode 8 is exposed to the electrolytic etchant, but is not etched since no electric potential is applied to the lower electrode 8.

Lastly, a single layer having electric insulation properties is formed as a sealing film 30 (for example, $Si_3N_4$ or $SiO_2$) on the rear surface of the substrate 4 to seal the cavity 10 as illustrated in FIG. 12C.

In order to seal the opening completely, the thickness of the sealing film 30 is desirably equal to or thicker than the thickness of the sacrificial layer 11, most desirably, 1.2 times the thickness of the sacrificial layer 11 or thicker.

Providing an etchant inlet on the rear surface of the substrate as in this embodiment eliminates the need to provide a sealing portion on the top side of the capacitive electromechanical transducer (membrane, in particular). The flatness of the capacitive electromechanical transducer on the front surface is thus improved. Further, the fact that there is no sealing portion in the membrane greatly improves the lifespan and reliability of the transducer.

Twelfth Embodiment

FIGS. 13A to 13K are sectional views illustrating process steps of a capacitive electromechanical transducer manufacturing method according to a twelfth embodiment of the present invention.

The transducer manufacturing process of this embodiment is similar to that of the first embodiment. A difference from the first embodiment is that a substrate having insulation properties (glass, for example) is used instead of a conductive substrate.

Figure 13A:
FIGS. 13A, 13B, 13C, 13D, 13E, 13F, 13G, 13H, 13I, 13J and 13K are sectional views for describing process steps of a capacitive electromechanical transducer according to a twelfth embodiment of the present invention.
Figure 13B:
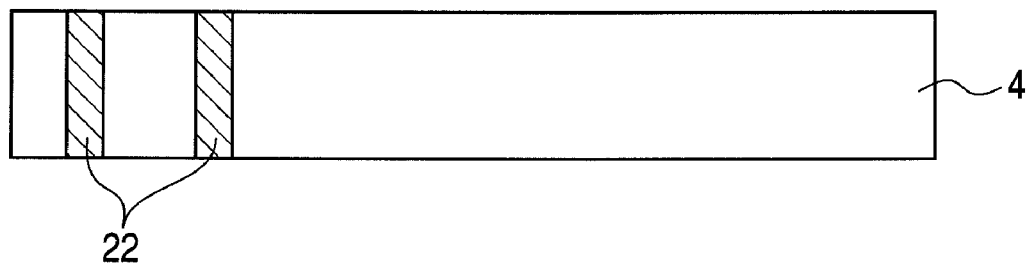
Figure 13C:
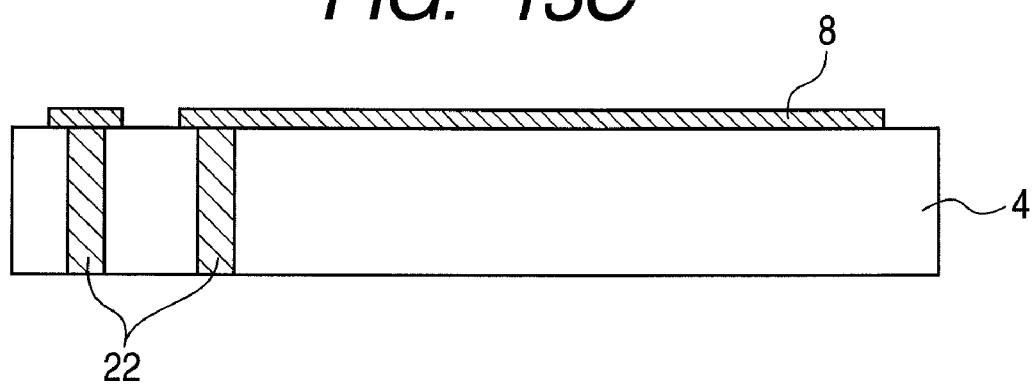
Figure 13D:
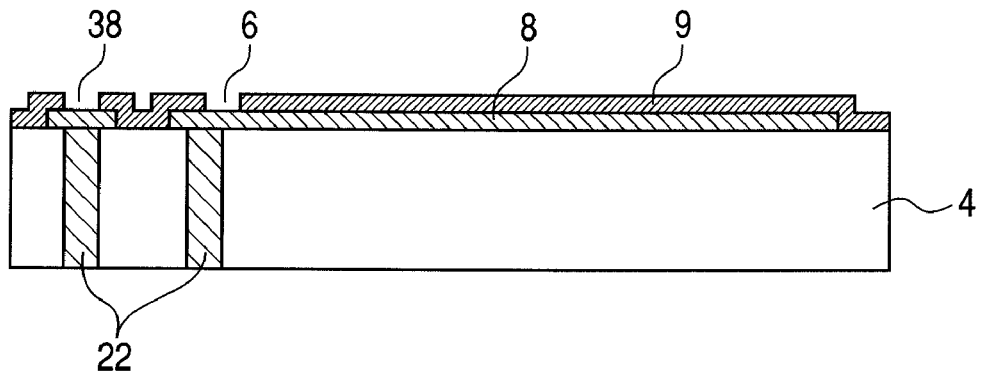
Figure 13E:
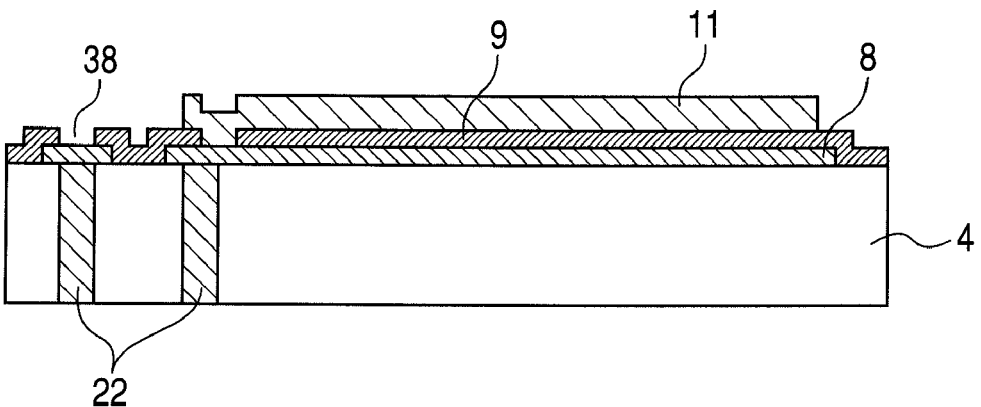
Figure 13F:
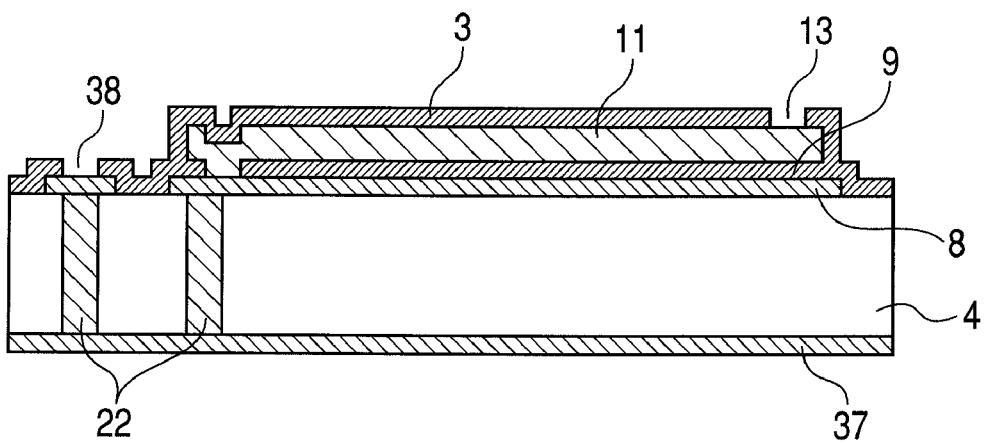

As illustrated in FIG. 13A, the substrate 4 (for example, a glass substrate with a diameter of 4 inches) is prepared and washed. Next, the through wiring conductive portion 22 which pierces the substrate 4 is provided as illustrated in FIG. 13B.

The substrate having substrate piercing wiring may be a commercially available one. For example, when photosensitive glass (PEG3, a product of HOYA CORPORATION) is utilized, a substrate piercing hole is opened and filled with metal (Cu or Ni) by plating. After metal through wiring is formed, the substrate surface is polished by chemical mechanical polishing (CMP) to form a substrate that has substrate piercing wiring. The surface roughness of the substrate is very important, for the performance of a capacitive transducer as that of the present invention, and a mean surface roughness Ra is desirably 10 nm or smaller, more desirably, 2 nm or smaller. With respect to the step coverage of the electric wiring, the level difference between the exposed surface of the substrate piercing wiring 22 and the surface of the substrate 4 is desirably 1 μm or smaller, more desirably, 0.2 μm or smaller.

Alternatively, an Si substrate may be etched and pierced by DRIE to form the substrate piercing wiring portion 22 by thermal oxidation or low pressure chemical vapor deposition (LPCVD). In this case, an insulator of the through wiring conductive portion 22 can be formed by thermal oxidation and the through wiring conductive portion 22 can also be formed from doped polycrystalline Si by LPCVD. This embodiment takes the aforementioned glass substrate as an example.

Figure 13G:
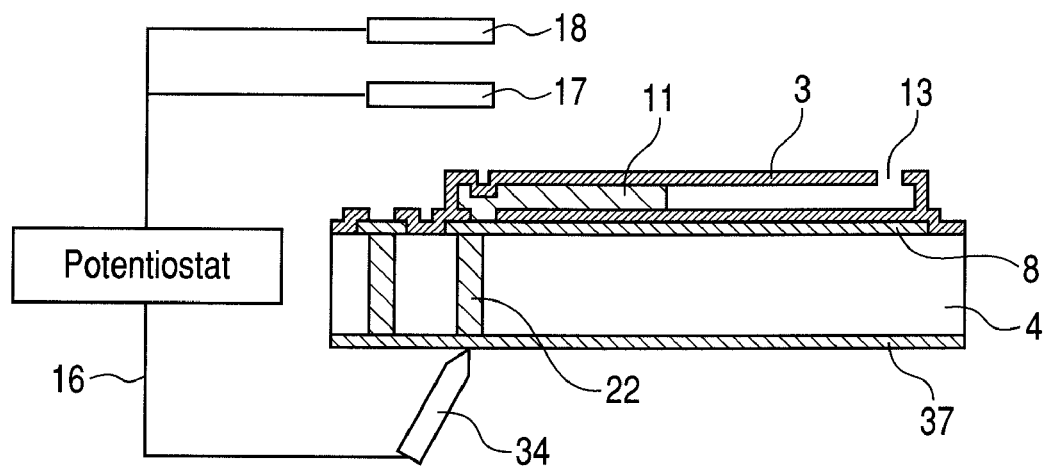

The film formation, patterning, etching, and other processes of FIGS. 13C to 13F are the same as the corresponding processes of FIGS. 2A to 2N described in the first embodiment. Subsequently, a single layer of, for example, Ti is formed as a conductive film 37 on the rear surface of the substrate 4 (to a thickness of 100 nm) as illustrated in FIG. 13G. A one-sided etching jig (not shown) is then used to form an electrical connection such that the conductive film 37 on the rear surface of the substrate is in contact with a work electrode 34. Thereafter, as in the first embodiment, the substrate is immersed in an electrolysis solution to etch the sacrificial layer 11 in contact with the lower electrode 8 by electrolytic etching through the conductive film 37 and the substrate piercing wiring 22.

Figure 13H:
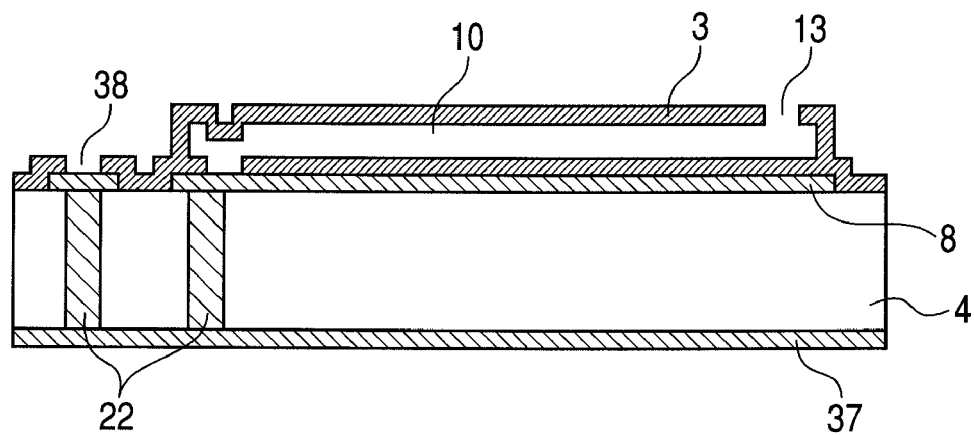

The subsequent step is the same as in the first embodiment, and the electrolytic etching is followed by a drying process to form the cavity 10 opened to the air as illustrated in FIG. 13H.

Figure 13I:
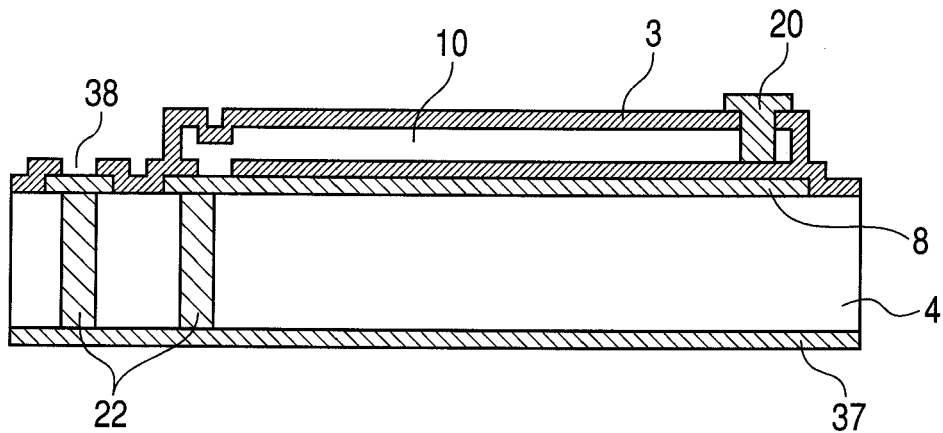
Figure 13J:
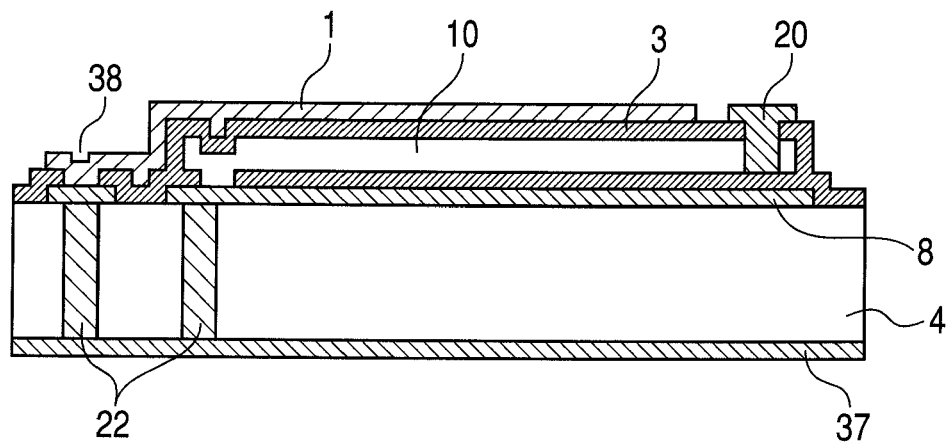

The next step is the same as in the first embodiment, and the etchant inlet 13 is sealed by PECVD with an insulating film such as $SiN_X$ or $SiO_2$ to form the sealing portion 20 as illustrated in FIG. 13I. An aperture is then opened by RIE in order to form a connection wiring portion 38, which connects the substrate piercing wiring and the upper electrode. As illustrated in FIG. 13J, the wiring portion 38 which connects the upper electrode 1 and the substrate piercing wiring 22 is formed by forming and patterning a metal layer.

Figure 13K:
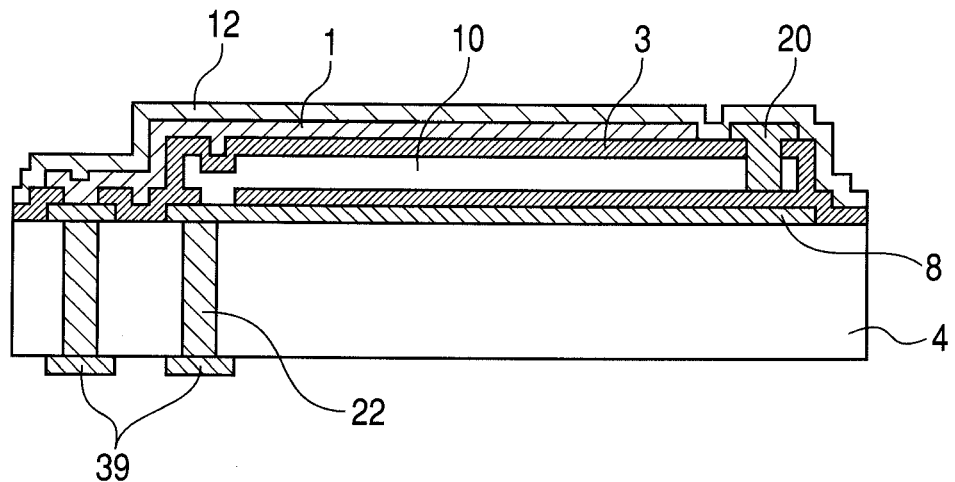

The next step is the same as in the first embodiment, and the protective film 12 having insulation properties is provided on top of the upper electrode 1 as illustrated in FIG. 13K. Lastly, the conductive film 37 on the rear surface of the substrate 4 is patterned to form a substrate piercing wiring pad 39 on the rear surface of the substrate. As illustrated in FIG. 13K, the lower electrode 8 and the upper electrode 1 can thus be led out to the rear surface of the substrate 4. This method is important particularly in the manufacture of a high density transducer array.

While FIG. 13K illustrating this embodiment illustrates a mode in which the piercing wiring conductive portion 22 connects to the lower electrode 8 and the upper electrode 1, a different wiring mode may be employed in which one of the lower electrode 8 and the upper electrode 1 is connected to the piercing wiring conductive portion 22 whereas the other electrode is led out to the front surface of the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-120391, filed May 2, 2008, and No. 2009-057263, filed Mar. 11, 2009, which are hereby incorporated by reference herein in their entirety.

The invention claimed is:

1. A method of manufacturing a capacitive electromechanical transducer, comprising:
   forming a first electrode on a substrate;
   forming an insulating layer on the first electrode, the insulating layer having an opening that leads to the first electrode;
   forming a sacrificial layer on the insulating layer;
   forming a membrane on the sacrificial layer, the membrane having a second electrode;
   providing an aperture that leads to the sacrificial layer from outside as an etchant inlet;
   etching the sacrificial layer to form a cavity; and
   sealing the aperture that serves as the etchant inlet,
   wherein the etching is executed by electrolytic etching in which a current is caused to flow between the first electrode and an externally placed counter electrode through the opening, the sacrificial layer, and the aperture.

2. A method of manufacturing a capacitive electromechanical transducer according to claim 1, wherein the aperture is formed in the membrane.

3. A method of manufacturing a capacitive electromechanical transducer according to claim 1, wherein the aperture of the membrane is placed on one end of the cavity whereas the opening of the insulating layer is placed on another end of the cavity.

4. A method of manufacturing a capacitive electromechanical transducer according to claim 1, wherein one of the aperture of the membrane and the opening of the insulating layer is placed in a center of the cavity whereas another one of the aperture of the membrane and the opening of the insulating layer is placed on a periphery of the cavity.

5. A method of manufacturing a capacitive electromechanical transducer according to claim 1, wherein:
   the cavity comprises a first cavity and a second cavity which is connected to the first cavity by a connection port; and
   etching is conducted by introducing an etchant from the connection port to at least one of the first cavity and the second cavity.

6. A method of manufacturing a capacitive electromechanical transducer according to claim 1, wherein the substrate comprises one of a semiconductor substrate and a glass substrate.

7. A method of manufacturing a capacitive electromechanical transducer, comprising:
   forming a first electrode on a substrate;
   forming an insulating layer on the first electrode;
   forming a sacrificial layer on the insulating layer;
   forming a membrane on the sacrificial layer;
   providing, in the membrane, multiple apertures including an aperture that serves as an etchant inlet;
   providing a second electrode on the membrane;
   etching the sacrificial layer to form a cavity; and
   sealing the aperture that serves as the etchant inlet, wherein the etching is executed by electrolytic etching in which a current is caused to flow between the second electrode and an externally placed counter electrode through, at least one of the multiple apertures of the membrane that leads to the second electrode, the sacrificial layer, and the aperture that serves as the etchant inlet.

8. A method of manufacturing a capacitive electromechanical transducer according to claim 7, wherein the aperture provided as the etchant inlet in the membrane is placed on one end of the cavity whereas the at least one of the multiple apertures of the membrane that leads to the second electrode is placed on another end of the cavity.

9. A method of manufacturing a capacitive electromechanical transducer according to claim 7, wherein one of the aperture provided as the etchant inlet in the membrane and the at least one of the multiple apertures of the membrane that leads to the second electrode is placed in a center of the cavity whereas another one of the aperture provided as the etchant inlet in the membrane and the at least one of the multiple apertures of the membrane that leads to the second electrode is placed on a periphery of the cavity.

10. A method of manufacturing a capacitive electromechanical transducer according to claim 7, wherein the substrate comprises one of a semiconductor substrate and a glass substrate.

11. A method of manufacturing a capacitive electromechanical transducer, comprising the steps of:
forming a first electrode on a substrate;
forming a sacrificial layer on the first electrode so that at least a part of the sacrificial layer is kept in contact with the first electrode;
forming a membrane on the sacrificial layer;
forming a second electrode on the membrane; and
while immersing an etching opening, which is provided so as to lead to the sacrificial layer from outside as an etchant inlet, in an electrolytic etchant, causing a current to flow between the first electrode which serves as one of electrodes for electrolytic etching and an externally placed electrode which serves as another electrode in contact with the electrolytic etchant, and etching the sacrificial layer by the electrolytic etching to form a cavity in a place from which the sacrificial layer has been removed.

12. A method of manufacturing a capacitive electromechanical transducer according to claim 11, wherein:
an insulating layer having an aperture is formed between the first electrode and the sacrificial layer; and
electric conduction is established between the first electrode and the sacrificial layer through the aperture.

* * * * *